(12) United States Patent
Ishida et al.

(10) Patent No.: US 8,183,594 B2
(45) Date of Patent: May 22, 2012

(54) LAMINAR STRUCTURE ON A SEMICONDUCTOR SUBSTRATE

(75) Inventors: Makoto Ishida, Toyohashi (JP); Kazuaki Sawada, Toyohashi (JP); Daisuke Akai, Hoi-gun (JP); Yiping Guo, Shanghai (CN)

(73) Assignee: National University Corporation Toyohashi University of Technology, Toyohashi-shi (JP)

( * ) Notice: Subject to any disclaimer, the term of this patent is extended or adjusted under 35 U.S.C. 154(b) by 0 days.

(21) Appl. No.: 12/450,182

(22) PCT Filed: Dec. 12, 2007

(86) PCT No.: PCT/JP2007/073922
§ 371 (c)(1),
(2), (4) Date: Nov. 5, 2009

(87) PCT Pub. No.: WO2008/111274
PCT Pub. Date: Sep. 18, 2008

(65) Prior Publication Data
US 2010/0096666 A1    Apr. 22, 2010

(30) Foreign Application Priority Data

Mar. 15, 2007  (JP) ................. 2007-066393
Jun. 8, 2007   (JP) ................. 2007-152277

(51) Int. Cl.
*H01L 23/14* (2006.01)

(52) U.S. Cl. ............ 257/190; 257/E23.005; 257/295; 427/126.3; 438/3

(58) Field of Classification Search ............ 257/295, 257/303, 306, E27.006, E21.663, E21.664, 257/E23.005, 190; 438/3; 428/126.3
See application file for complete search history.

(56) References Cited

U.S. PATENT DOCUMENTS

| | | | |
|---|---|---|---|
| 5,798,903 A | 8/1998 | Dhote et al. | |
| 6,515,402 B2 | 2/2003 | Klee et al. | |
| 6,972,510 B2 | 12/2005 | Klee et al. | |
| 2005/0040516 A1 | 2/2005 | Sakashita et al. | |
| 2006/0278907 A1* | 12/2006 | Ishida et al. | 257/295 |
| 2007/0007860 A1 | 1/2007 | Takabe et al. | |

FOREIGN PATENT DOCUMENTS

JP   A-08-330540   12/1996
(Continued)

OTHER PUBLICATIONS

X.Y. Chen et al, "Growth of completely (110) oriented Pt film on Si (100) by using MgO as a buffer by pulsed laser deposition", 2002, Applied Physics A, vol. 74, pp. 567-569.*

(Continued)

*Primary Examiner* — Ha Tran T Nguyen
*Assistant Examiner* — Suberr Chi
(74) *Attorney, Agent, or Firm* — Oliff & Berridge, PLC

(57) ABSTRACT

An object of the present invention is to provide a ferroelectric element having excellent properties, which includes a monocrystalline film of $\gamma\text{-}Al_2O_3$ formed as a buffer layer on a silicon substrate. The monocrystalline $\gamma\text{-}Al_2O$ film is formed on the silicon substrate which is the lowermost layer of an MFMIS structure. On the monocrystalline $\gamma\text{-}Al_2O_3$ film, there is formed an electrically conductive oxide in the form of a LaNiO3 film as a lower electrode. On the LaNiO3 film, there is formed a PZT thin film which is a ferroelectric material. On the PZT thin film, there is formed a Pt film as an upper electrode.

7 Claims, 28 Drawing Sheets

FOREIGN PATENT DOCUMENTS

| | | |
|---|---|---|
| JP | A-08-335672 | 12/1996 |
| JP | A-08-340087 | 12/1996 |
| JP | A-10-027886 | 1/1998 |
| JP | A-11-053935 | 2/1999 |
| JP | A-11-274433 | 10/1999 |
| JP | A-2000-509200 | 7/2000 |
| JP | A-2004-281742 | 10/2004 |
| JP | A-2007-043095 | 2/2007 |
| WO | WO 2004/061881 A1 | 7/2004 |

OTHER PUBLICATIONS

T.F. Tseng et al, "Effect of LaNiO3/Pt double layers on the characteristics of (PbxLa1-x)(ZryTi1-y)O3 thin films", 1996, Applied Physics Letters, vol. 68, pp. 2505-2507.*

Y. Guo et al, "The performance of Pt bottom electrode and PZT films deposited on Al2O3/Si substrate by using LaNiO3 film as an adhesion layer", Nov. 21, 2007, Solid State Communications, vol. 145, pp. 413-417.*

* cited by examiner (a) RHOMBIC CRYSTAL SYSTEM (b) PSEUDO-TETRAGONAL CRYSTAL SYSTEM (a) GENUINE CRYSTAL STRUCTURE OF SrRuO₃

(b) PSEUDO-TETRAGONAL CRYSTAL SYSTEM OF SrRuO₃

FIG.9

|  | ROTATING SPEED | TIME |
|---|---|---|
| 1st | 1000rpm | 5sec |
| 2nd | 3500rpm | 30sec |

(a) 2θ-ω SCAN     (b) LOCKING CURVE (a) 2θ-ω SCAN (b) LOCKING CURVE (a) Pt/γ-Al$_2$O$_3$/Si(001)  (b) SrRuO$_3$/Pt/γ-Al$_2$O$_3$/Si(001)

FIG.26

| 1 | SPIN COATING | • 1st : 1500rpm: 10sec |
| --- | --- | --- |
|   |   | • 2nd : 4000rpm: 20sec |
| 2 | DRYING | • 150°C, 5min |
| 3 | PYROLYSIS | • 400°C, 5min |
| 4 | ANNEALING | • 650°C(+50°C/sec), 90sec |
|   |   | • $O_2$: 0.5 slm |

(a) POLYCRYSTALLINE PZT ON Pt(111)/Ti/SiO$_2$/Si(001) SUBSTRATE (b) EPITAXIAL PZT ON SrRuO$_3$/Pt/γ·Al$_2$O$_3$ (111) SUBSTRATE

LAMINAR STRUCTURE ON A SEMICONDUCTOR SUBSTRATE

TECHNICAL FIELD

The present invention relates to a laminar structure on a semiconductor substrate, which uses a ferroelectric thin film.

BACKGROUND ART

In recent years, there have been made researches and developments of various devices using pyroelectric and piezoelectric properties of a ferroelectric. Examples of these devices which utilize the properties of the ferroelectric include ultrasonic sensors and infrared sensors. As the materials of the ferroelectric, perovskite type ferroelectric materials, in particular, $PbZr_{1-x}Ti_xO_3$ (PZT) and (Pb, La)TiO$_3$ (PLT) are excellent in the piezoelectric and pyroelectric properties, and are expected to be used as the materials of the various sensors.

Where the ferroelectric is used for the various sensors, it is required to integrate (unite) the ferroelectric and a signal processing circuit, for reducing the size and noise of the sensor system. For the integration of the ferroelectric and signal processing circuit, it is required to form a thin film of a ferroelectric material and the signal processing circuit on a semiconductor substrate such as a silicon substrate.

Where the thin film of the ferroelectric material is formed on the silicon substrate, it is known to form a buffer layer on the silicon substrate. The buffer layer formed on the silicon substrate makes it possible to reduce a risk of lattice mismatch between the silicon material and the ferroelectric material. The buffer layer also functions as a barrier layer for preventing diffusion of Pb of the ferroelectric material into the silicon substrate, and as an insulating film for electric insulation between a thin film of a lower electrode formed immediately under the thin film of the ferroelectric material, and the silicon substrate.

Based on the finding described above, the inventors of the present invention fabricated an element, by forming the buffer layer in the form of a monocrystalline film of γ-Al$_2$O$_3$ on the silicon substrate, forming the lower electrode in the form of a Pt film on the buffer layer, and forming the thin film of the ferroelectric material on the Pt film, as described in Patent Document 1 identified below. The platinum (Pt) film used as the lower electrode is conventionally used as the electrode material for the thin film of the ferroelectric material such as PZT. Pt has a most dense filler structure, namely, a face-centered cubic lattice (FCC) structure, which has a strong tendency of self-orientation toward the (111) face even on an amorphous material such as SiO$_2$, so that the thin film of the ferroelectric material on the Pt film also has a strong tendency of orientation. However, the Pt film having the strong tendency of self-orientation suffers from a growth of a columnar crystal, and has a problem of easy diffusion of Pb into the substrate along a grain boundary of the columnar crystal. Where the Pt film is used as the lower electrode, the Pt film also has a problem of peeling at the boundary between Pt of the lower electrode and oxides such as SiO$_2$, a monocrystalline film of γ-Al$_2$O$_3$ and PZT. In view of these problems of Pt used for the lower electrode, it has been proposed to replace Pt by an electrically conductive oxide as the lower electrode material, as described in Patent Documents 2-6 identified below.

Patent Document 1: JP-2004-281742 A
Patent Document 2: JP-11-274433 A
Patent Document 3: JP-2000-509200 A
Patent Document 4: JP-8-340087 A
Patent Document 5: JP-8-335672 A
Patent Document 6: JP-8-330540 A Patent Document 2 discloses an element including a silicon substrate, an impurity diffusion layer and a lower barrier metal layer ((Ti, Al)N) formed on the silicon substrate, a lower electrode thin film of SrRuO$_3$ formed on the impurity diffusion layer and lower barrier metal layer, and a thin film of the ferroelectric material in the form of a thin film of BSTO formed on the lower electrode thin film. Patent Document 3 discloses an element including a silicon substrate, films of TiN and Pt formed on an insulating layer on the silicon substrate, and an electrically conductive oxide layer in the form of a perovskite layer such as lanthanum strontium cobalt oxide (LSCO).

Patent Documents 3, 4 and 5 disclose elements each including a silicon substrate, a buffer layer of MgAl$_2$O$_4$ (magnesium.aluminum.spinel) formed on the silicon substrate, and an electrode in the form of a thin film of SrRuO formed on the buffer layer.

DISCLOSURE OF THE INVENTION

Object Achieved by the Invention

The elements disclosed in the above-identified Patent Documents 2-6 use the electrically conductive oxides as the material of the electrode for the thin film of the ferroelectric material. It is difficult to grow the electrically conductive oxide with a high degree of orientation directly on the silicon substrate, and therefore it is necessary to form an adequate buffer layer on the silicon substrate. However, such an adequate buffer layer has not yet been developed. The inventors of the present invention was successful in the epitaxial growth of a monocrystalline film of γ-Al$_2$O$_3$ on the monocrystalline silicon substrate. Accordingly, it is desirable to fabricate a ferroelectric thin film element which includes a thin film of an electrically conductive oxide that is formed as a lower electrode for a thin film of a ferroelectric material, on a buffer layer in the form of a monocrystalline film of γ-Al$_2$O$_3$, and which solves the problems of Pt used for the lower electrode, owing to optimization of conditions for the formation of the thin film of the electrically conductive oxide.

The present invention was made to solve the problems described above. It is therefore an object of the present invention to provide a ferroelectric element which includes a monocrystalline film of γ-Al$_2$O$_3$ as a buffer layer formed on a silicon substrate and which has excellent properties.

The present invention was made to achieve the above-described object, and is defined by claim 1 which provides a laminar structure on a semiconductor substrate, having a monocrystalline film of γ-Al$_2$O$_3$ expitaxially grown on the above-indicated semiconductor substrate, and characterized by being further provided with an electrode in the form of a thin film of an oxide which is formed on the above-indicated monocrystalline film of γ-Al$_2$O$_3$ and which has a metal oxide layer ABO$_3$ (A representing at least one element selected from a group consisting of Sr and La, while B representing at least one element selected from a group consisting of Ru and Ni) of a pseudo-tetragonal crystal system having a perovskite structure. According to the present invention, the electrode in the form of the thin film of the oxide is formed on the monocrystalline film of γ-Al$_2$O$_3$ expitaxially grown on the semiconductor substrate, so that the crystallinity of the electrode in the form of the thin film of the oxide can be improved. Further, the provision of the monocrystalline film of γ-Al$_2$O$_3$ on which the electrode in the form of the thin film of the oxide is formed makes it possible to improve adhesion between the monocrystalline film of γ-Al$_2$O$_3$ and the electrode in the form of the thin film of the oxide. It is noted that the pseudo crystal system is a crystal system wherein two tetragonal crystals are superimposed on each other in an orthorhombic system.

The laminar structure of the present invention may be characterized by an oriented thin film of a ferroelectric material laminated on the above-indicated electrode in the form of the thin film of the oxide. According to this form of the invention, the oriented thin film of the ferroelectric material can be formed with excellent properties. Further, the thin film of the ferroelectric material formed on the lower electrode in the form of the thin film of the oxide permits improvement in the adhesion between the thin film of the ferroelectric material and the electrode in the form of the thin film of the oxide.

The laminar structure of the present invention may be characterized by an upper electrode provided on the above-indicated thin film of the ferroelectric material. According to this form of the invention, a detector element can be provided by using the thin film of the ferroelectric material.

The laminar structure of the present invention may be characterized in that the above-indicated semiconductor substrate is a monocrystalline substrate of silicon. According to this form of the invention wherein the monocrystalline substrate of silicon is used as the semiconductor substrate, the individual thin films can be strongly oriented, enabling the thin film of the ferroelectric material to have excellent properties.

The laminar structure of the present invention may be characterized in that the above-indicated metal oxide layer ABO$_3$ is MRuO$_3$ (M=Ca, Sr, Ba). According to this form of the invention, the electrode in the form of the thin film of the oxide can be used as the lower electrode.

The laminar structure of the present invention may be characterized in that the metal oxide layer is SrRuO$_3$ which is formed on the monocrystalline film of γ-Al$_2$O$_3$ via a Pt layer. According to this form of the invention, the Pt layer on which the electrode in the form of the thin film of the oxide is formed permits an improvement of the crystallinity of the electrode.

The laminar structure of the present invention may be characterized in that the above-indicated metal oxide layer ABO$_3$ is LaNiO$_3$. According to this form of the invention, the electrode in the form of the thin film of the oxide can be used as the lower electrode for the ferroelectric material.

The laminar structure of the present invention may be characterized in that the above-indicated metal oxide layer LaNiO$_3$, monocrystalline film of γ-Al$_2$O$_3$ and monocrystalline substrate of silicon are all (001)-oriented. According to this form of the invention, the individual thin films are (001)-oriented so that the thin film of the ferroelectric material is (001)-oriented and has excellent properties.

The present invention further provides a laminar structure on a semiconductor substrate, having a thin film of LaNiO$_3$ (LNO) on the semiconductor substrate, and characterized by being further provided with a (110)-oriented thin film of Pt on the above-indicated thin film of LNO. According to the present invention, the thin film of LNO is formed on the semiconductor substrate, and the Pt film is formed on the thin film of LNO, so that the thin film of LNO which tends to be (111)-oriented can be (110)-oriented.

The laminator structure of the present invention may be characterized by a buffer layer between the above-indicated semiconductor substrate and thin film of LNO. According to this form of the invention, the buffer layer can restrict a reaction between the semiconductor layer and the thin film of LNO.

The laminar structure of the present invention may be characterized in that the above-indicated buffer layer is an insulating layer. According to this form of the invention, the thin film of LNO and the semiconductor substrate are electrically insulated from each other by the insulating layer, permitting easy fabrication of the laminar structure on the semiconductor substrate.

The laminar structure of the present invention may be characterized in that the above-indicated buffer layer is an epitaxially grown thin film of γ-Al$_2$O$_3$. According to this form of the invention, the epitaxially grown thin film of film of γ-Al$_2$O$_3$ makes it possible to facilitate the formation of the thin film of LNO having a high quality.

The laminar structure of the present invention may be characterized by an oriented thin film of a ferroelectric material laminated on the above-indicated thin film of Pt. According to this form of the invention, it is possible to form the strongly oriented thin film of the ferroelectric material having excellent properties.

The laminar structure of the present invention may be characterized by being further provided with an upper electrode on the above-indicated thin film of the ferroelectric material. According to this form of the invention, a detector element or a memory element can be constituted by using the thin film of the ferroelectric material.

The laminar structure of the present invention may be characterized in that the thin film of the ferroelectric material is a (110)-oriented thin film of Pb(Zr, Ti)O$_3$. (110)-oriented thin film of Pb(Zr, Ti)O$_3$ provided according to this form of the invention has more excellent properties than a (100)- or (111)-oriented thin film of Pb(Zr, Ti)O$_3$.

The laminar structure of the present invention may be characterized in that the above-indicated semiconductor substrate is a monocrystalline substrate of silicon. According to this form of the invention wherein the monocrystalline substrate of silicon is used as the semiconductor substrate, the individual thin films can be strongly oriented, enabling the thin film of the ferroelectric material to have excellent properties.

The laminar structure of the present invention may be characterized in that the above-indicated thin film of LaNiO$_3$, monocrystalline film of γ-Al$_2$O$_3$ and monocrystalline substrate of silicon are all (100)-oriented. According to this form of the invention, the individual thin films are (100)-oriented so that the thin film of Pt is easily (110)-oriented, permitting the thin film of the ferroelectric material to have excellent properties.

Advantages of the Invention

According to the present invention, the monocrystalline film of γ-Al$_2$O$_3$ is formed as a buffer layer on the semiconductor substrate, the thin films are formed on the monocrystalline film of γ-Al$_2$O$_3$, so that the crystallinity of the thin films can be improved.

Further, the improvement of the crystallinity of the thin film of the oxide as the lower electrode for the thin film of the ferroelectric material permits excellent properties of the thin film of the ferroelectric material. In addition, the thin film of LaNiO$_3$ on the semiconductor substrate permits (110)-orientation of the upper thin film of Pt on the LaNiO$_3$ thin film. Accordingly, a (110)-oriented thin film of Pb(Zr, Ti)O$_3$ can be obtained. This (110)-oriented thin film of Pb(Zr, Ti)O$_3$ exhibits more excellent ferroelectric and pysoelectric properties than the conventional (111)- or (100)-oriented thin film of Pb(Zr, Ti)O$_3$, and therefore permits more improved properties of sensors, actuators and non-volatile memory elements than bulk ceramics.

BRIEF DESCRIPTION OF THE DRAWINGS

FIG. 9 is a view indicating spin coating conditions in the Example 1 of the present invention.

FIG. 26 is a flow chart for explaining a process of forming a PZT thin film by the sol-gel method in the Example 3 of the present invention.

EXPLANATION OF REFERENCE SIGNS

Figure 1:
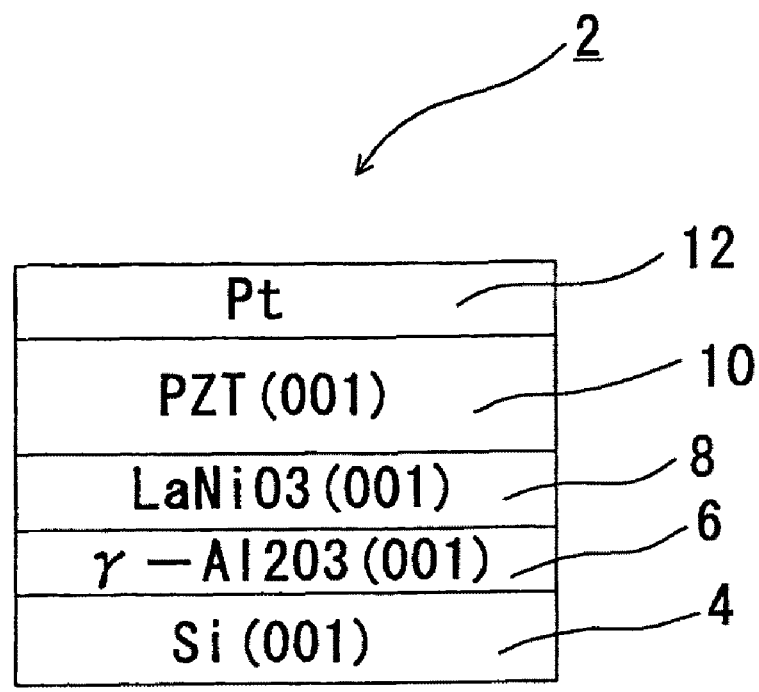
FIG. 1 is a cross sectional view showing an overall arrangement of a first embodiment of the present invention.

2: MFMIS structure
4: Silicon substrate
6: $\gamma$-$Al_2O_3$ monocrystalline film
8: $LaNiO_3$ film
10: PZT thin film
12: Pt film
14: MFMIS structure
16: Silicon substrate
18: $\gamma$-$Al_2O_3$ monocrystalline film
20: $SrRuO_3$ film
22: PZT thin film
24: Pt film
26: MFMIS structure
28: Silicon substrate
30: $\gamma$-$Al_2O_3$ monocrystalline film
32: Pt film
34: $\gamma$-$Al_2O_3$ monocrystalline film
36: PZT thin film
38: Pt film

BEST MODE FOR CARRYING OUT THE INVENTION

A first embodiment of the present invention will be described. FIG. 1 is a cross sectional view showing an arrangement of a thin film 2 of an MFMIS (Metal-Ferroelectric-Metal-Insulator-Semiconductor) structure according to the first embodiment.

The MFMIS structure 2 shown in FIG. 1 has a silicon substrate 4 as the lowermost layer. The silicon substrate 4 is a (001)-oriented monocrystalline substrate. On the silicon substrate 4, there is formed a monocrystalline film 6 of $\gamma$-$Al_2O_3$. The monocrystalline film 6 of $\gamma$-$Al_2O_3$ is formed by epitaxial growth on the silicon substrate 4, such that the monocrystalline film 6 of $\gamma$-$Al_2O_3$ is (001)-oriented. The monocrystalline film 6 of $\gamma$-$Al_2O_3$ is used as an insulating film for the MFMIS structure 2, and also as a buffer layer for the films formed thereon.

The monocrystalline film 6 of $\gamma$-$Al_2O_3$ has a composition similar to that of sapphire ($\alpha$-$Al_2O_3$). Although the sapphire has a hexagonal system, the monocrystalline film 6 of $\gamma$-$Al_2O_3$ formed on the silicon substrate 4 has a tetragonal system, and a $\gamma$ phase having a defective spinel structure. The monocrystalline film 6 of $\gamma$-$Al_2O_3$ used in the MFMIS structure 2 has an excellent diffusion barrier function, and is a physically and chemically stable thin film. Further, the monocrystalline film 6 of $\gamma$-$Al_2O_3$ has a low effective lattice mismatch (2.4%) with silicon, and a comparatively high dielectric constant ($\in_r$~7.36) and an excellent insulating property.

Therefore, the monocrystalline film 6 of $\gamma$-$Al_2O_3$ is said to be more excellent than other insulating materials that can be epitaxially grown. For example, $MgAl_2O_4$ is a material stable at a high temperature and having a high resistance to chemicals, but cannot be grown with high crystallinity at a low temperature. $CaF_2$ is not highly resistant to some chemicals, and has a problem of limitation in the structure of a device to be fabricated using $CaF_2$, and the process of fabrication of the device.

For instance, the monocrystalline film 6 of $\gamma$-$Al_2O_3$ is formed by a UHV-CVD (Ultra High Vacuum Chemical Vapor Deposition) process. The UHV-CVD process uses a turbo molecular pump in its exhaust system, to establish a back pressure of $10^{-7}$ Pa, and can reduce $H_2O$ and other contamination gases. The UHV-CVD process uses a Cold-Wall type heater for heating only the substrate, so as to prevent a gas flow from the wall of a chamber in the process of heating. For the growth of the monocrystalline film 6 of $\gamma$-$Al_2O_3$, the UHV-CVD process uses TMA (Tri-Methyl Aluminum: $Al(Ch_3)_3$) as a source of Al, and $O_2$ gas as a source of oxygen.

Figure 2:
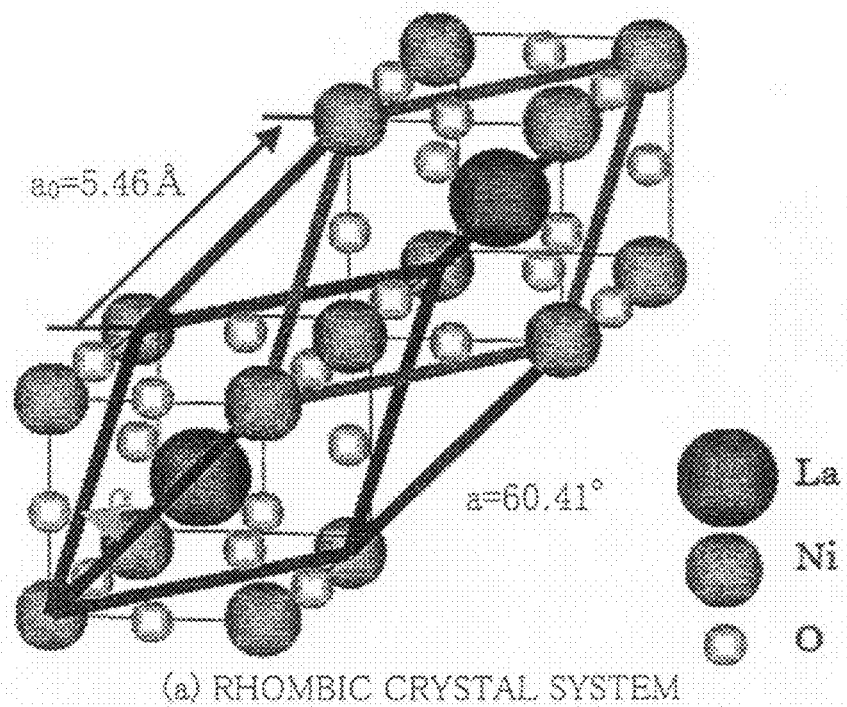
FIG. 2 is a cross sectional view for explaining a crystal structure of $LaNiO_3$ in the first embodiment of the present invention.
Figure 2:
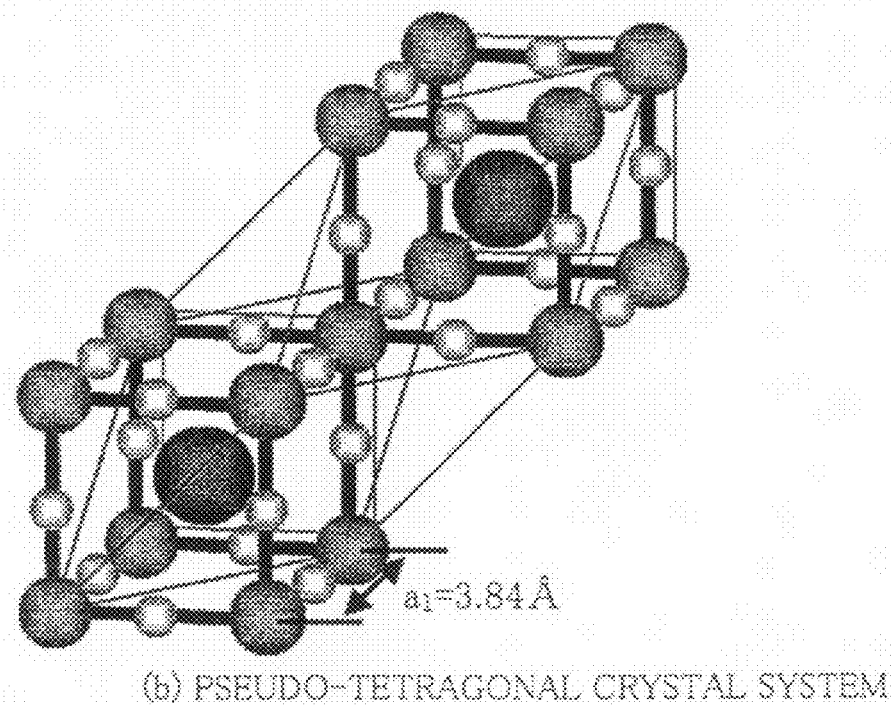

A film 8 of $LaNiO_3$ (LNO) is formed on the monocrystalline film 6 of $\gamma$-$Al_2O_3$. The LNO film 8 is a kind of an electrically conductive oxide used as a lower electrode for a thin film of a ferroelectric material. The LNO film 8 is (001)-oriented FIG. 2 shows a crystal structure of LNO constituting the LNO film 8. FIG. 2 showing the crystal structure of LNO of the LNO film 8 indicates at (a) a rhombic system of the crystal structure, and at (b) a pseudo-tetragonal system of the crystal structure.

The crystal structure of LNO constituting the LNO film 8 is a perovskite structure as shown at (a) in FIG. 2, which has a lattice constant $a_0$=5.46 angstroms (0.546 nm), $\alpha$=60.41°. This crystal structure may be considered to be a tetragonal system, which is said to be a perovskite structure of a pseudo-tetragonal system. The pseudo-tetragonal crystal system which is shown at (b) in FIG. 2 has a lattice constant $a_1$=3.83 angstroms (0.383 nm).

Where the LNO film 8 is used as the lower electrode for the thin film of the ferroelectric material in the form of a thin film 10 of PZT, it is important to pay attention to matching between the LNO film 8 and the monocrystalline film 6 of $\gamma$-$Al_2O_3$, and matching between the LNO film 8 and the PZT thin film 10.

The LNO film 8 and the monocrystalline film 6 of $\gamma$-$Al_2O_3$ have a lattice mismatch of −3.8%. Although this mismatch percent is not so low, it is considered that the LNO film 8 can grow epitaxially on the monocrystalline film 6 of $\gamma$-$Al_2O_3$ in view of a past research finding that demonstrates that a film of Pt having a lattice mismatch of −3.6% with the monocrystalline film 6 of $\gamma$-$Al_2O_3$ can grow epitaxially on the monocrystalline film 6 of $\gamma$-$Al_2O_3$.

The LNO film 8 and the PZT thin film 10 have a lattice mismatch of 4.8%, which is slightly high. However, since both of the LNO of the LNO film 8 and the PZT of the PZT thin film 10 have a perovskite crystal structure, it is considered that the PZT thin film 10 can grow epitaxially on the LNO film 8.

The LNO film 8 is formed by a physical process such as RF sputtering or pulse laser deposition (PLD), or a chemical process such as an organic metal chemical vapor deposition (MOCVD), solution method or sol-gel method.

The PZT thin film 10 is formed on the LNO film 8. The PZT constituting the PZT thin film 10 is lead zirconate titanate, namely, $Pb(Zr, Ti)O_3$, which is a totally solid solution $PbZrO_3$—$PbTiO_3$ consisting of two components, that is, an antiferroelectric material in the form of lead zirconate ($PbZrO_3$) and a ferroelectric material in the form of lead titanate ($PbTiO_3$).

It is known that the crystal structure of the epitaxially grown PZT has a more excellent pyroelectric property than that of a polycrystalline PZT. The PZT having a tetragonal crystal system has higher pyroelectricity in the case of (001) orientation, while the PZT having a rhombic crystal structure has higher pyroelectricity in the case of (111) orientation. It is known that the (001)-oriented PZT has highest pyroelectricity where the Zr/Ti ratio is 40/60. In the present embodiment, therefore, the PZT constituting the PZT thin film 10 has the Zr/Ti ratio of 40/60, and is (001)-oriented.

A film 12 of Pt is formed on the PZT thin film 10. The Pt film 12 functions as an upper electrode.

As described above, the MFMIS structure 2 according to the first embodiment of this invention includes the monocrystalline film 6 of $\gamma$-$Al_2O_3$, LNO film 8, PZT thin film 10 and Pt film 12 that are sequentially laminated on the silicon substrate 4. This thin film 2 is subjected to a suitable operation to obtain a desired sensor element which is operable utilizing the pyroelectricity of the ferroelectric material.

In the MFMIS structure 2 according to the present embodiment, the monocrystalline film 6 of $\gamma$-$Al_2O_3$ is formed on the silicon substrate 4, as a buffer layer that permits the LNO film 8 to be epitaxially grown on the monocrystalline film 6 of $\gamma$-$Al_2O_3$. Since the monocrystalline film 6 of $\gamma$-$Al_2O_3$ can be epitaxially grown on the monocrystalline silicon substrate, the LNO film 8 can be epitaxially grown on the LNO film 8 to be epitaxially grown on the monocrystalline film 6 of $\gamma$-$Al_2O_3$.

Further, the monocrystalline film 6 of $\gamma$-$Al_2O_3$ is formed as the barrier layer on the silicon substrate 4 in the MFMIS structure 2 according to the present embodiment, it is possible to prevent diffusion of Pb and Si between the PZT thin film 10 and the silicon substrate 4.

Further, the LNO film 8 to be epitaxially grown on the monocrystalline film 6 of $\gamma$-$Al_2O_3$ having high crystallinity is used as the insulating film in the MFMIS structure 2 according to the present embodiment, so that it is possible to suitably orientate the PZT thin film 10. Accordingly, where the LNO film 8 to be epitaxially grown on the monocrystalline film 6 of $\gamma$-$Al_2O_3$ is (001)-oriented, the PZT thin film 10 can be (001)-oriented so as to have an excellent pyroelectric property.

Further, the LNO film 8 is used as the lower electrode on the monocrystalline film 6 of $\gamma$-$Al_2O_3$ in the MFMIS structure 2 according to the present embodiment, so that the LNO film 8 has improved adhesion to the monocrystalline film 6 of $\gamma$-$Al_2O_3$. If a Pt film was used as the lower electrode, a peel-off phenomenon might take place at the boundary between the lower electrode of Pt and the monocrystalline film 6 of $\gamma$-$Al_2O_3$, due to stresses during firing of the PZT thin film 10. In the present embodiment wherein the LNO film 8 is used as the lower electrode, it is possible to prevent such a peel-off phenomenon at the boundary between the LNO film 8 and the monocrystalline film 6 of $\gamma$-$Al_2O_3$. It is considered that the peel-off phenomenon can be prevented owing to an improvement of the adhesion between the monocrystalline film 6 of $\gamma$-$Al_2O_3$ and the LNO film 8, both of which are oxides.

Further, the adhesion between the LNO film 8 and the PZT thin film 10 can be improved since the LNO film 8 is used as the lower electrode in the MFMIS structure 2 according to the present embodiment. It is considered that this improvement of the adhesion is achieved since both of the LNO film 8 and the PZT thin film 10 are oxides.

Further, the PZT thin film 10 can be easily grown epitaxially since the LNO film 8 that is used as the lower electrode has the same perovskite structure as the PZT thin film 10 in the present MFMIS structure 2.

Figure 3:
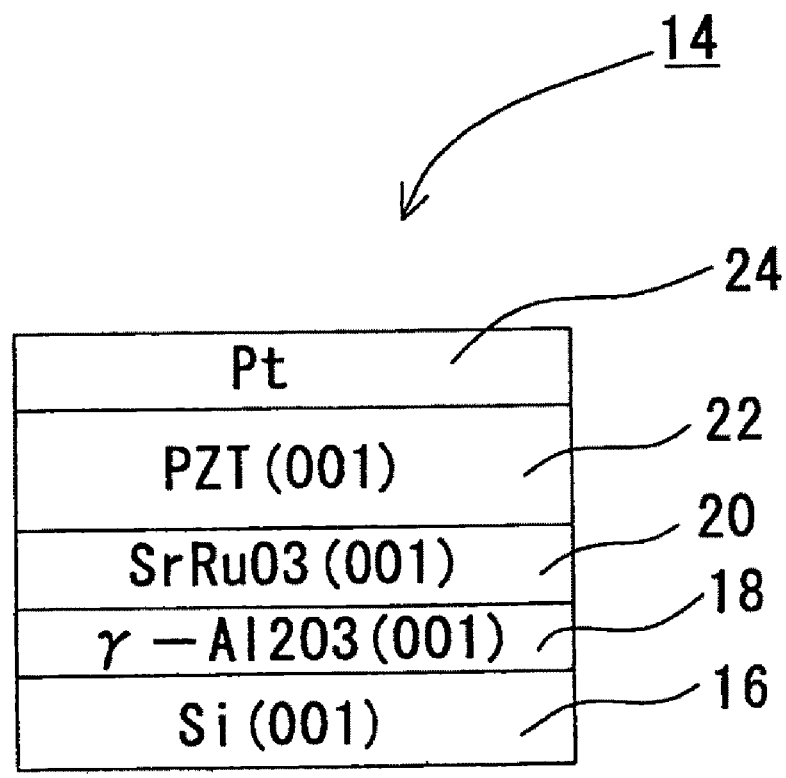
FIG. 3 is a cross sectional view showing an overall arrangement of a second embodiment of the present invention.

Then, a second embodiment of the present invention will be described. FIG. 3 is a cross sectional view showing an arrangement of a thin film 14 of an MFMIS structure according to the second embodiment. As shown in FIG. 3, the MFMIS structure 14 has a silicon substrate 16 as the lowermost layer. The silicon substrate 16 is a (001)- or (111)-oriented monocrystalline substrate.

On the silicon substrate 16, there is formed a monocrystalline film 18 of $\gamma$-$Al_2O_3$. The monocrystalline film 18 of γ-$Al_2O_3$ is used as an insulating film for the MFMIS structure 14, and also as a buffer layer for the films formed thereon.

Figure 4:
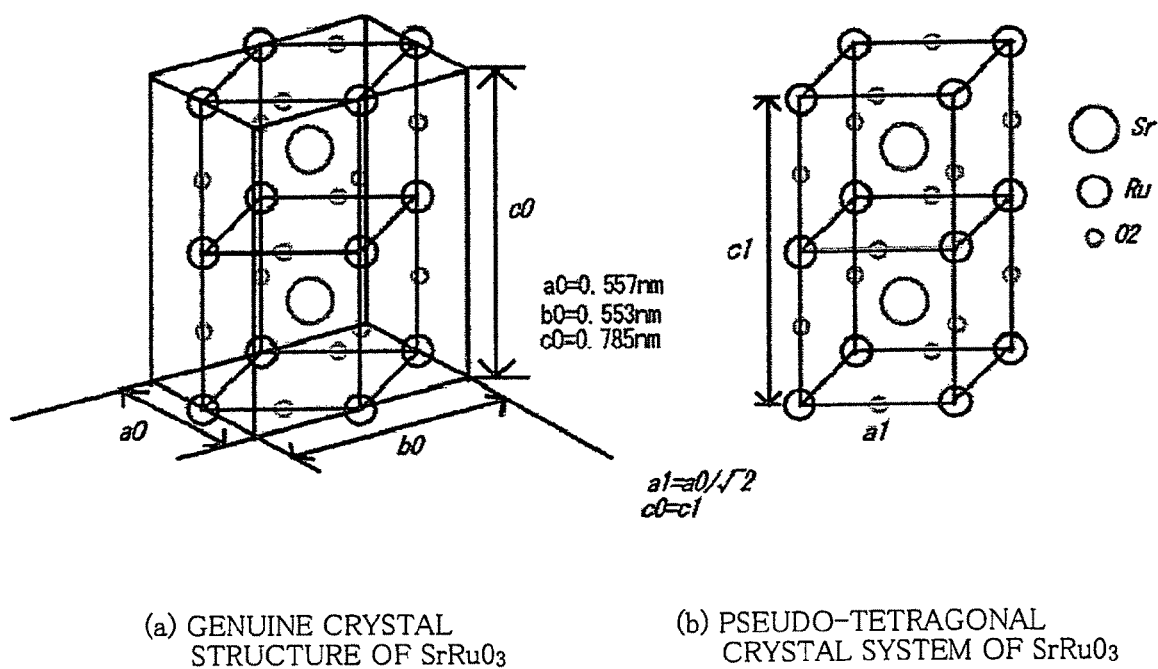
FIG. 4 is a view for explaining a crystal structure of $SrRuO_3$ in the second embodiment of the present invention.

A film 20 of $SrRuO_3$ (SRO) is formed as a lower electrode on the monocrystalline film 18 of γ-$Al_2O_3$. $SrRuO_3$ constituting the SRO film 20 is an electrically conductive oxide in the form of strontium ruthenate. FIG. 4 shows a crystal structure of SRO. FIG. 4 showing the crystal structure of SRO indicates at (a) an orthorhombic system of the crystal structure having three axes having respective different lengths, and at (b) a crystal system wherein two tetragonal crystals are superimposed on each other in an orthorhombic system. This crystal system wherein the two tetragonal crystals are superimposed on each other in an orthorhombic system is defined as a pseudo-tetragonal crystal system. When the SRO has the pseudo-tetragonal system, the SRO crystal structure is considered to have a perovskite structure.

The SRO film 20 which is formed on the monocrystalline film 18 of γ-$Al_2O_3$ has a lattice mismatch with the monocrystalline film 18 of γ-$Al_2O_3$, which is as low as about −1%, so that the SRO film 20 can grow epitaxially on the monocrystalline film 18 of γ-$Al_2O_3$.

A thin film 22 of PZT is formed on the SRO film 20. The PZT thin film 22 is lead zirconate titanate, namely, $Pb(Zr, Ti)O_3$ having a perovskite structure, which is a totally solid solution $PbZrO_3$—$PbTiO_3$ consisting of two components, that is, an antiferroelectric material in the form of lead zirconate ($PbZrO_3$) and a ferroelectric material in the form of lead titanate ($PbTiO_3$). A film 24 of Pt is formed as the upper electrode on the PZT thin film 22.

As described above, the MFMIS structure 14 according to the second embodiment of this invention includes the monocrystalline film 18 of γ-$Al_2O_3$, SRO film 20, PZT thin film 22 and Pt film 24 that are sequentially laminated on the silicon substrate 16. This thin film 14 is subjected to a suitable operation to obtain a desired sensor element which is operable by utilizing the pyroelectricity of the ferroelectric material.

In the MFMIS structure 14 according to the present embodiment, the monocrystalline film 18 of γ-$Al_2O_3$ is formed as the buffer layer that permits the SRO film 20 and the PZT thin film 22 to be epitaxially grown on the monocrystalline film 18 of γ-$Al_2O_3$. Accordingly, the PZT thin film 22 have excellent properties.

Further, the SRO film 20 is used as the lower electrode on the monocrystalline film 18 of γ-$Al_2O_3$ in the MFMIS structure thin film 14 according to the present embodiment, so that the SRO film 20 has improved adhesion to the monocrystalline film 18 of γ-$Al_2O_3$.

Further, the adhesion between the SRO film 20 and the PZT thin film 22 can be improved since the SRO film 20 is used as the lower electrode in the MFMIS structure thin film 14 according to the present embodiment. In addition, the SRO film 20 has excellent properties at the boundary with the PZT thin film 22, advantageously preventing deterioration of the properties of the PZT. Further, the SRO film 20 is highly effective to function as a barrier layer for preventing diffusion of Pb of the PZT thin film 22, enabling the PZT thin film 22 to maintain the excellent properties.

Figure 5:
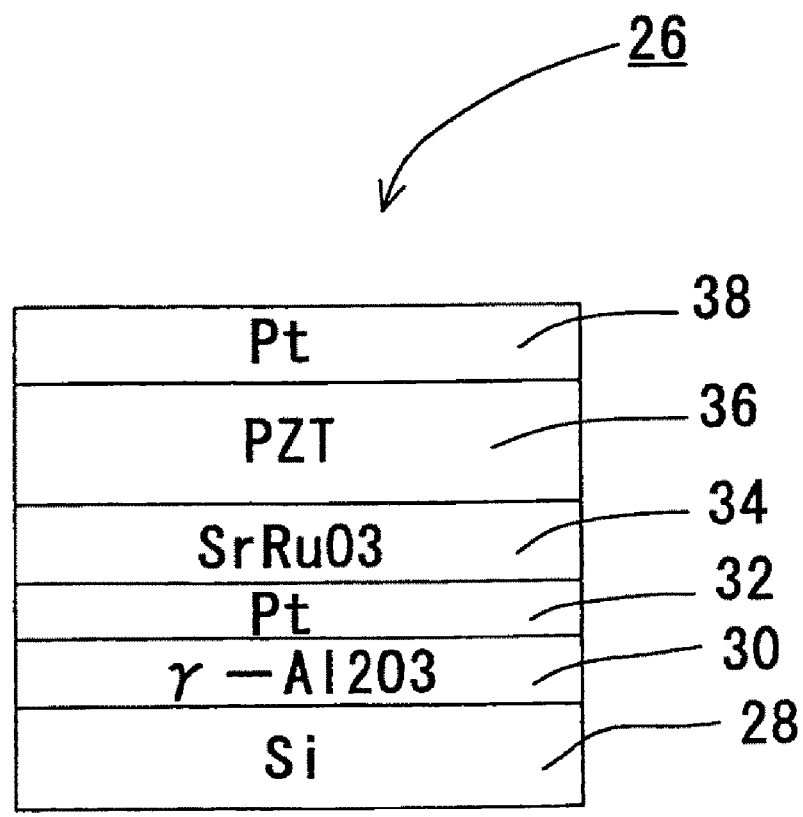
FIG. 5 is a cross sectional view showing an overall arrangement of a third embodiment of the present invention.

Then, a third embodiment of the present invention will be described. FIG. 5 is a cross sectional view showing an arrangement of a thin film 26 of an MFMIS structure according to the third embodiment. As shown in FIG. 5, the MFMIS structure 26 has a silicon substrate 28 as the lowermost layer. On the silicon substrate 28, there is formed a monocrystalline film 30 of γ-$Al_2O_3$. On the monocrystalline film 30 of γ-$Al_2O_3$, there is formed a film 32 of Pt. On the Pt film 32, there is formed a film 34 of $SrRuO_3$ (SRO) as the lower electrode. On the SRO film 34, there is formed a thin film 36 of PZT. On the PZT thin film 36, there is formed a film 38 of Pt as the upper electrode.

The MFMIS structure 26 according to the third embodiment of this invention described above includes the Pt film 32 formed on the monocrystalline film 30 of γ-$Al_2O_3$, so that the SRO film 34 formed on the Pt film 32 can be suitably oriented, making it possible to improve the properties of the PZT thin film 36 formed on the SRO film 34.

In the MFMIS structure 26 according to the present embodiment wherein the Pt film 32 is provided, the SRO film 34 formed as the lower electrode has a reduced electric resistance value, permitting an adequate measurement of the properties of the PZT thin film 36.

Figure 6:
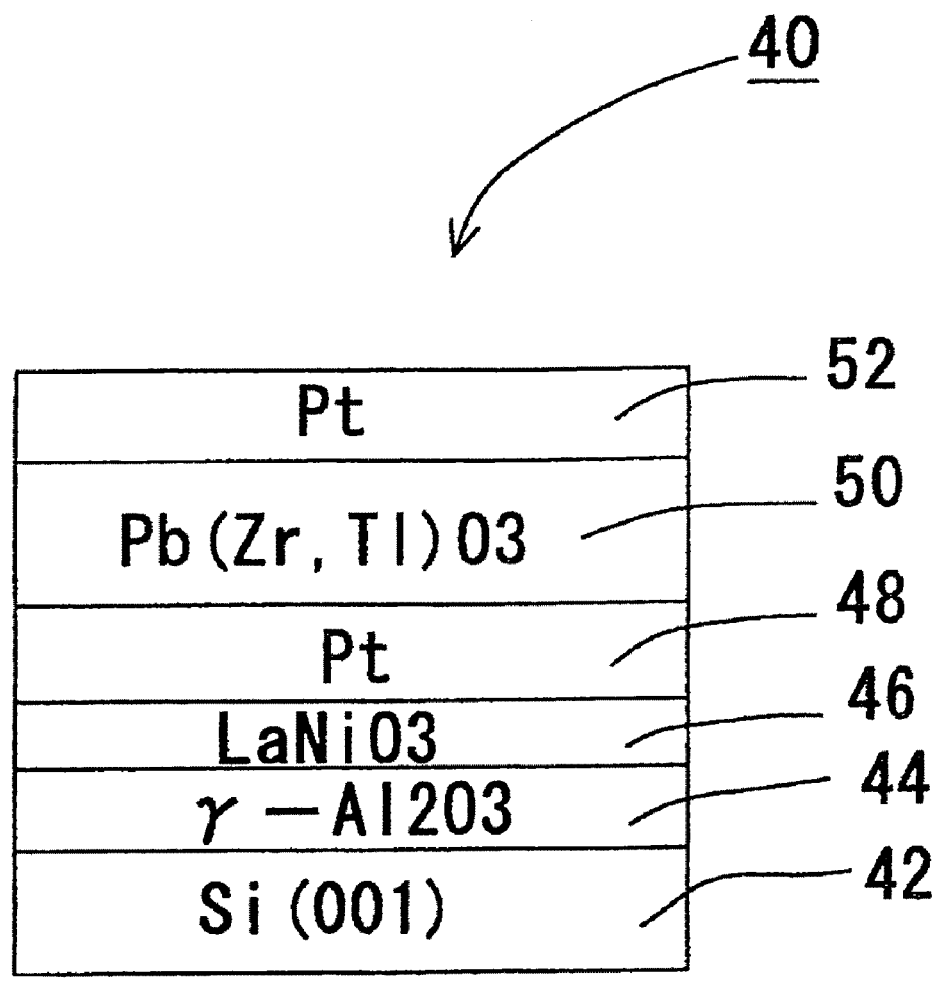
FIG. 6 is a cross sectional view showing an overall arrangement of a fourth embodiment of the present invention.

Then, a fourth embodiment of the present invention will be described. FIG. 6 is a cross sectional view showing an arrangement of an MFMIS (Metal-Ferroelectric-Metal-Insulator-Semiconductor) structure 40 according to the fourth embodiment.

The MFMIS structure 40 shown in FIG. 6 has a silicon substrate 42 as the lowermost layer. The silicon substrate 42 is a (100)-oriented monocrystalline substrate. On the silicon substrate 42, there is formed a monocrystalline film 44 of γ-$Al_2O_3$. The monocrystalline film 44 of γ-$Al_2O_3$ is formed by epitaxial growth on the silicon substrate 42 such that the monocrystalline film 44 of γ-$Al_2O_3$ is (001)-oriented. The monocrystalline film 44 of γ-$Al_2O_3$ is used as an insulating film for the MFMIS structure 40, and also as a buffer layer for the films formed thereon.

The monocrystalline film 44 of γ-$Al_2O_3$ has a composition similar to that of sapphire (α-$Al_2O_3$). Although the sapphire has a hexagonal crystal system, the monocrystalline film 44 of γ-$Al_2O_3$ formed on the silicon substrate 42 has a tetragonal crystal system, and a γ phase having a defective spinel structure. The monocrystalline film 44 of γ-$Al_2O_3$ used in the MFMIS structure 40 has an excellent diffusion barrier function, and is a physically and chemically stable thin film. Further, the monocrystalline film 44 of γ-$Al_2O_3$ has a low effective lattice mismatch (2.4%) with silicon, and a comparatively high dielectric constant ($\in_r$~7.36) and an excellent insulating property.

Therefore, the monocrystalline film 44 of γ-$Al_2O_3$ is said to be more excellent than other insulating materials that can be epitaxially grown. For example, $MgAl_2O_4$ is a material stable at a high temperature and having a high resistance to chemicals, but cannot be grown with high crystallinity at a low temperature. $CaF_2$ is not highly resistant to some chemicals, and has a problem of limitation in the structure of a device to be fabricated using $CaF_2$, and the process of fabrication of the device.

For instance, the monocrystalline film 44 of γ-$Al_2O_3$ is formed by a UHV-CVD (Ultra High Vacuum Chemical Vapor Deposition) process. The UHV-CVD process uses a turbo molecular pump in its exhaust system, to establish a back pressure of $10^{-7}$ Pa, and can reduce $H_2O$ and other contamination gases. The UHV-CVD process uses a Cold-Wall type heater for heating only the substrate, so as to prevent a gas flow from the wall of a chamber in the process of heating. For the growth of the monocrystalline film 4 of γ-$Al_2O_3$, the UHV-CVD process uses TMA (Tri-Methyl Aluminum: $Al(Ch_3)_3$) as a source of Al, and $O_2$ gas as a source of oxygen.

A film 46 of $LaNiO_3$ (LNO) is formed on the monocrystalline film 44 of γ-$Al_2O_3$. The LNO film 46 is a kind of an electrically conductive oxide, and is (100)-oriented.

The LNO film 46 is formed by a physical process such as RF sputtering or pulse laser deposition (PLD), or a chemical process such as an organic metal chemical vapor deposition (MOCVD), solution method or sol-gel method.

A thin film 48 of Pt is formed on the LNO film 46, and is used as a lower electrode for a thin film of a ferroelectric material. The Pt film 48 is (110)-oriented.

A thin film 50 of PZT is formed on the Pt film 48. The PZT constituting the PZT thin film 50 is lead zirconate titanate, namely, Pb(Zr, Ti)$O_3$, which is a totally solid solution PbZr$O_3$—PbTi$O_3$ consisting of two components, that is, an antiferroelectric material in the form of lead zirconate (PbZr$O_3$) and a ferroelectric material in the form of lead titanate (PbTi$O_3$).

It is known that the crystal structure of the epitaxially grown PZT has a more excellent pyroelectric property than that of a polycrystalline PZT.

A film 52 of Pt is formed on the PZT thin film 50. The Pt film 52 functions as an upper electrode.

As described above, the MFMIS structure 40 according to the present embodiment of this invention includes the monocrystalline film 44 of γ-$Al_2O_3$, LNO film 46, Pt film 48, PZT thin film 50 and Pt film 52 that are sequentially laminated on the silicon substrate 42. This thin film structure is subjected to a suitable operation to obtain a desired sensor element which is operable utilizing the pyroelectric and other properties of the ferroelectric material.

In the MFMIS structure 40 according to the present embodiment, the monocrystalline film 44 of γ-$Al_2O_3$ is formed on the silicon substrate 42, as a buffer layer that permits improved crystallinity of the LNO film 46 formed on the monocrystalline film 44 of γ-$Al_2O_3$.

Further, the monocrystalline film 44 of γ-$Al_2O_3$ is formed as the barrier layer on the silicon substrate 42 in the MFMIS structure 40 according to the present embodiment, it is possible to prevent diffusion of Pb and Si between the PZT thin film 50 and the silicon substrate 42.

Further, the LNO film 46 is formed on the monocrystalline film 44 of γ-$Al_2O_3$ in the MFMIS structure 40 according to the present embodiment, so that the LNO film 46 has improved adhesion to the monocrystalline film 44 of γ-$Al_2O_3$. If a Pt film was formed as the lower electrode on the monocrystalline film 44 of γ-$Al_2O_3$, a peel-off phenomenon might take place at the boundary between the Pt film and the monocrystalline film 44 of γ-$Al_2O_3$, due to stresses during firing of the PZT thin film 50. In the present embodiment wherein the LNO film 46 is used as the lower electrode, it is possible to prevent such a peel-off phenomenon at the boundary between the LNO film 46 and the monocrystalline film 44 of γ-$Al_2O_3$. It is considered that the peel-off phenomenon can be prevented owing to an improvement of the adhesion between the monocrystalline film 44 of γ-$Al_2O_3$ and the LNO film 46, both of which are oxides.

Examples

Example 1 according to the first embodiment of this invention will be described.

(Formation of γ-$Al_2O_3$ Film)

Figure 7:
FIG. 7 is a view indicating RHEED patterns of a $\gamma$-$Al_2O_3$ film in Example 1 of the present invention.
Figure 7:
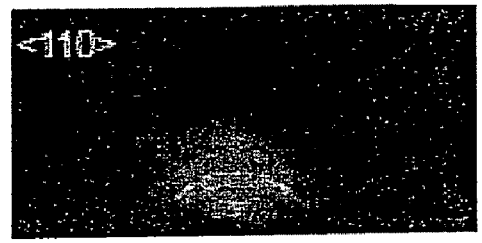

The γ-$Al_2O_3$ film was epitaxially grown on a (001)-oriented silicon substrate. Conditions for the epitaxial growth in a Cold-Wall CVD apparatus include: a substrate temperature of 930° C.; a pressure of 750 Pa; and a growth time of 30 minutes. The formed γ-$Al_2O_3$ film had a thickness of 50 nm. RHEED patterns of the epitaxially grown monocrystalline film of γ-$Al_2O_3$ are indicated in FIG. 7. It will be understood from FIG. 7 that each RHEED pattern is a spot pattern like a ring, and that the RHEED pattern changes depending upon the direction of incidence.

(Formation of LNO Film)

Figure 8:
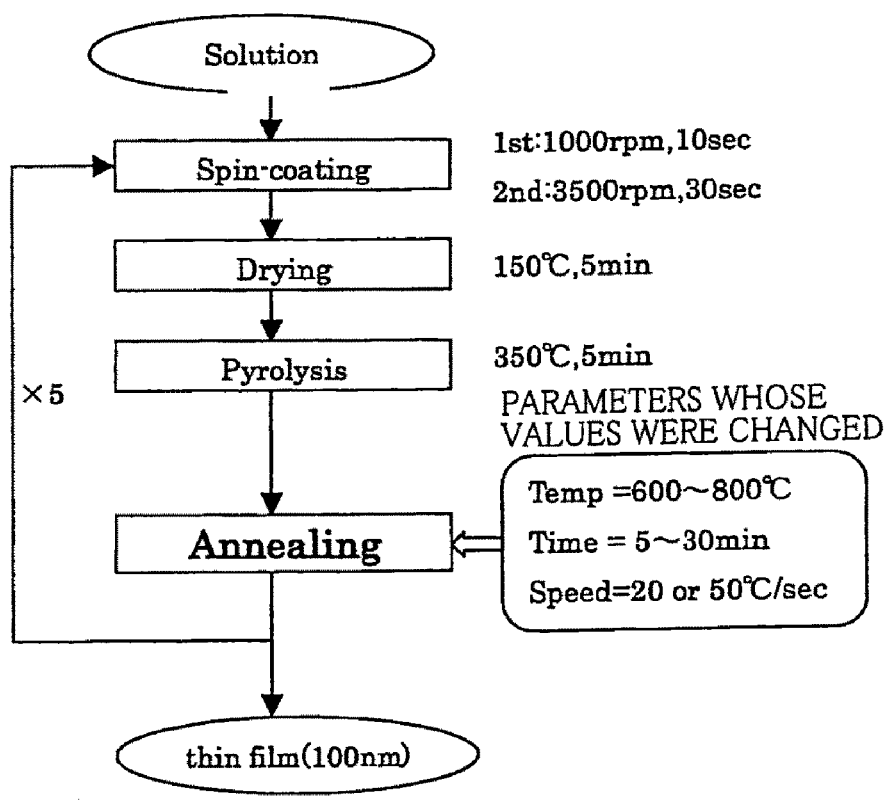
FIG. 8 is a flow chart for explaining a process of forming an LNO film by a sol-gel method in the Example 1 of the present invention.

Then, an LNO film was formed on the γ-$Al_2O_3$ film. The LNO film was formed by a sol-gel method. A process of the LNO film by the sol-gel method is shown in FIG. 8. As shown in the flow chart of FIG. 8, the sol-gel method includes a step of coating a desired substrate with a precursor solution to form a coating film, a step of drying the film of the precursor solution by a suitable heat treatment, and a step of decomposing and removing organic components of the precursor solution, to eventually crystallize the precursor into a thin film of LNO having a desired composition. In the present example, the coating step was implemented by a spin-coating operation which requires a relatively small amount of the precursor solution. In the present example, the precursor solution had a precursor concentration of 0.3M, and the spin-coating operation was performed under the conditions indicated in FIG. 9. Each layer of the LNO film was about 20 nm.

(Dependency Upon Annealing Temperature)

The crystallization of the precursor into the LNO film takes place in the annealing step of the sol-gel method indicated in the flow chart of FIG. 8. Accordingly, the annealing conditions appear to have an influence on the crystallinity of the LNO film. In view of this assumption, two parameters, that is, the temperature of the sample in the annealing step and the annealing time were changed.

Figure 10:
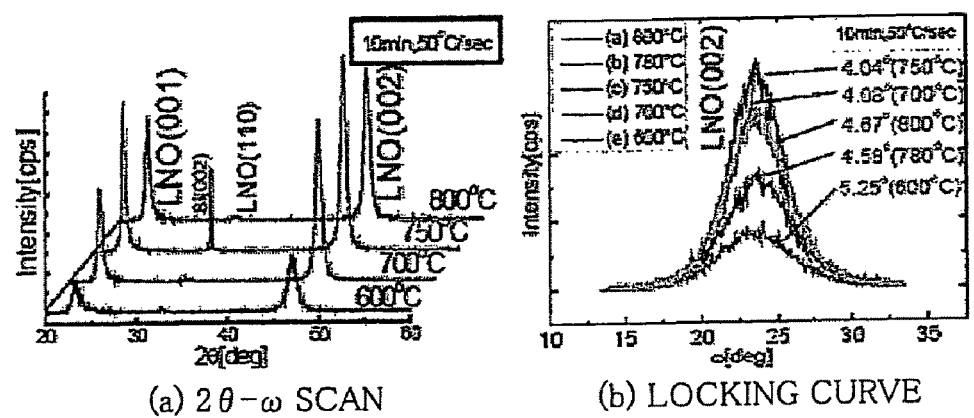
FIG. 10 is a view indicating XRD patterns and locking curves in the Example 1 of the present invention.

XRD patterns of the samples measured at different temperatures of the samples within a range between 600° C. and 800° C. are indicated at (a) in FIG. 10, and locking curves of the samples are indicated at (b) in the same figure. As indicated at (a) in FIG. 10, substantially no peaks of the (100) and other faces other than the (001) face were observed at all of the different annealing temperatures. This indicates that the film was (001)-oriented. Comparison of the peak intensities revealed that the peak intensity of the face (001) at 600° C. was lower than those at the higher temperatures. The peak intensities at the temperatures from 700° C. to 800° C. did not have a considerable difference, and the highest peak intensity was obtained at 750° C.

Regarding the locking curves indicated at (b) in FIG. 10, the smallest half-value width of 4.04° was obtained at 750° C. Further, the peak intensity and the half-value width were respectively low and small at 600° C., presumably because the LNO film was not completely crystallized at such a low annealing temperature. In addition, tendencies of an increase of the peak intensity increases and a decrease of the half-value width with an increase of the annealing temperature were not observed at the temperature of 800° C., presumably because the decomposition of LaNi$O_3$ was initiated at that high annealing temperature, resulting in a tendency of a change of the composition. It follows from the above-described analysis that the LNO film can be obtained with strongest (001) orientation at the annealing temperature of 750° C.

Figure 11:
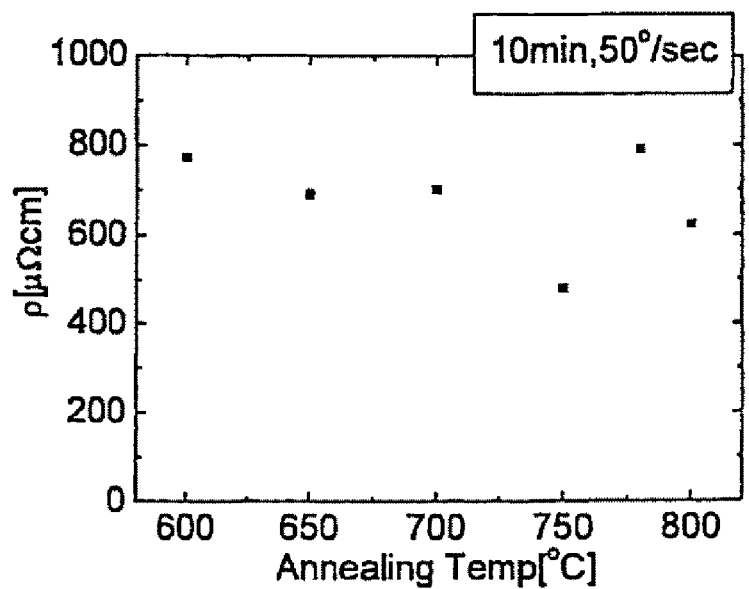
FIG. 11 is a view indicating a result of measurement of a specific resistance of the LNO film in the Example 1 of the present invention.

A specific resistance of the LNO film measured at different annealing temperatures within a range between 600° C. and 800° C. is indicated in FIG. 11. It will be understood from FIG. 11 that the specific resistance tended to decrease with an increase of the annealing temperature up to 750° C., exhibiting the lowest value at 750° C., and to increase with the increase of the annealing temperature from 750° C. Thus, the LNO film having the lowest specific resistance was obtained at the annealing temperature of 750° C. It was found from the analysis of the orientation and specific resistance of the LNO film that the optimum annealing temperature was 750° C.

(Dependency Upon Annealing Time)

Figure 12:
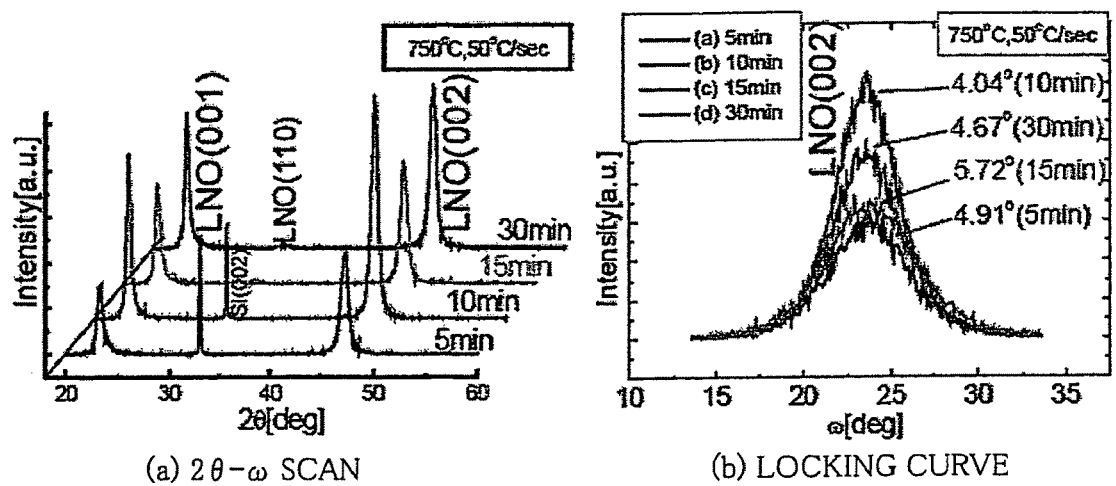
FIG. 12 is a view indicating XRD patterns and locking curves in the Example 1 of the present invention.

The XRD patterns of the samples subjected to the annealing step for different annealing times within a range between 5 minutes and 30 minutes are indicated at (a) in FIG. 12, and the locking curves of the samples are indicated at (b) in the same figure. As indicated at (a) in FIG. 12, the film was (001)-oriented for all of the different annealing times. The highest peak intensity was obtained in the case of the annealing time of 10 minutes. Regarding the locking curves indicated at (b) in FIG. 12, the smallest half-value width of 4.04° was obtained in the case of the annealing time of 10 minutes. It follows from the above-described analysis that the LNO film can be obtained with the strong (001) orientation in the case of the annealing time of 10 minutes.

Figure 13:
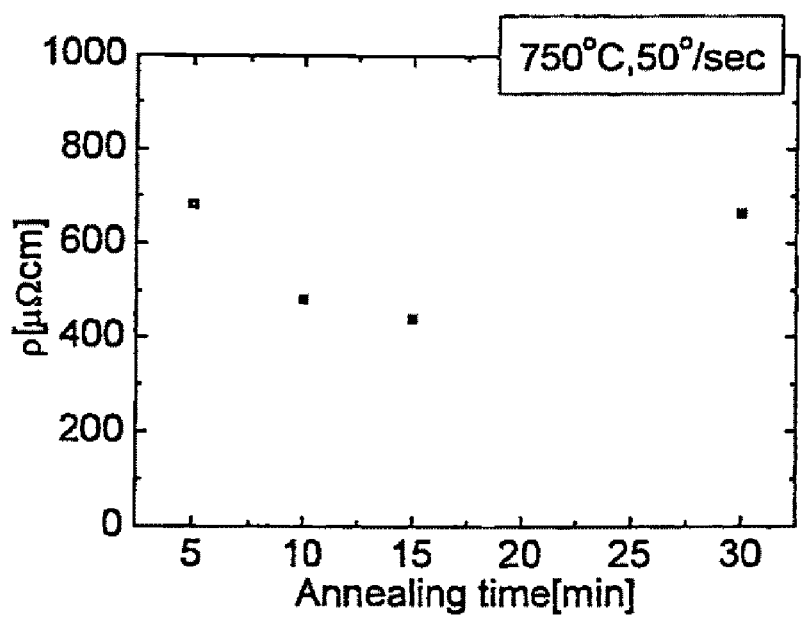
FIG. 13 is a view indicating a result of measurement of the specific resistance of the LNO film in the Example 1 of the present invention.

The specific resistance of the LNO film measured in the cases of the different annealing times within the range of 5-30 minutes is indicated in FIG. 13. It will be understood from FIG. 13 that the specific resistance tended to decrease with an increase of the annealing time up to 15 minutes, exhibiting the lowest value in the case of the annealing time of 15 minutes. Thus, the LNO film having the low specific resistance was obtained in the cases of the annealing times within a range of 10-15 minutes. It was found from the analysis of the orientation and specific resistance of the LNO film that the optimum annealing time was 10 minutes.

(Formation of PZT Thin Film)

Figure 14:
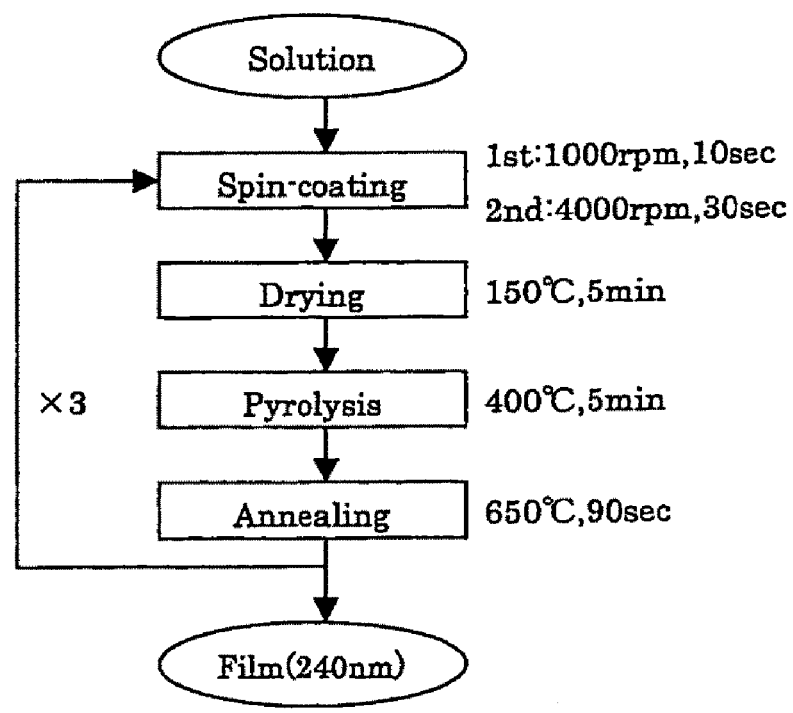
FIG. 14 is a flow chart for explaining a process of forming a PZT thin film by the sol-gel method in the Example 1 of the present invention.

A PZT thin film was formed on the LNO film with strong (001) orientation formed on the $\gamma$-$Al_2O_3$ film. The PZT thin film was formed by the sol-gel method. The flow chart of FIG. 14 illustrates the process of the PZT thin film by the sol-gel method. For the (001) orientation of the PZT thin film, the Zr/Ti ratio of PZT used was 40/60, as described above. In the spin-coating step indicated in FIG. 14, each layer of the PZT thin film was about 80 nm. Since the PZT thin film consists of three layers, the total thickness was about 240 nm.

(Evaluation of PZT Thin Film)

Figure 15:
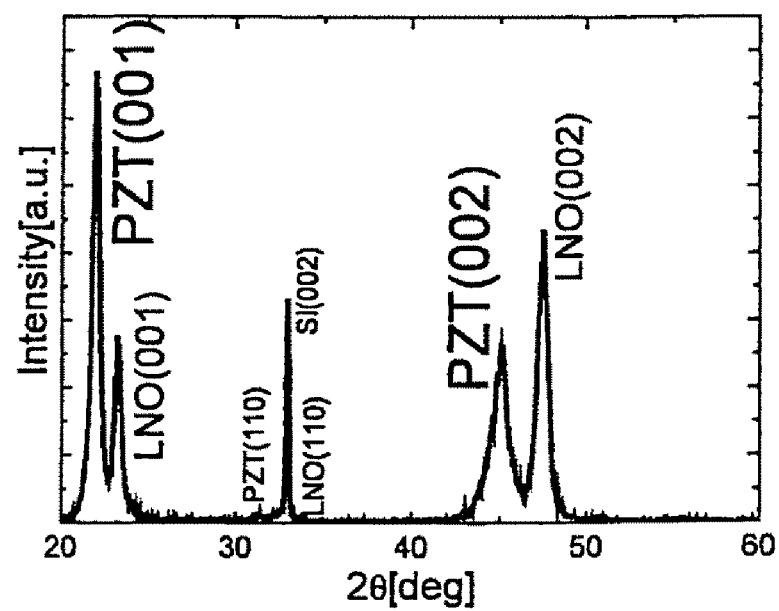
FIG. 15 is a view indicating an XRD pattern in the Example 1 of the present invention.

The measured XRD pattern of the PZT thin film on a composite LNO/$\gamma$-$Al_2O_3$/Si(001) substrate is indicated in FIG. 15. It will be understood from FIG. 15 that the formed PZT thin film was strongly (001)-oriented. The use of the composite LNO/$\gamma$-$Al_2O_3$/Si(001) substrate realized the (001) orientation of PZT.

(Formation of Upper Pt Film)

To evaluate the electric properties of the obtained laminar structure, a Pt film was formed as the upper electrode on the composite PZT/LNO/$\gamma$-$Al_2O_3$/Si substrate. The Pt film was formed by a sputtering method. Conditions for the sputtering operation include: a substrate temperature equal to the room temperature; RF power of 50 W; and a sputtering time of 6 minutes. The formed Pt film was about 100 nm.

(Leakage Current Property of PZT Thin Film)

Figure 16:
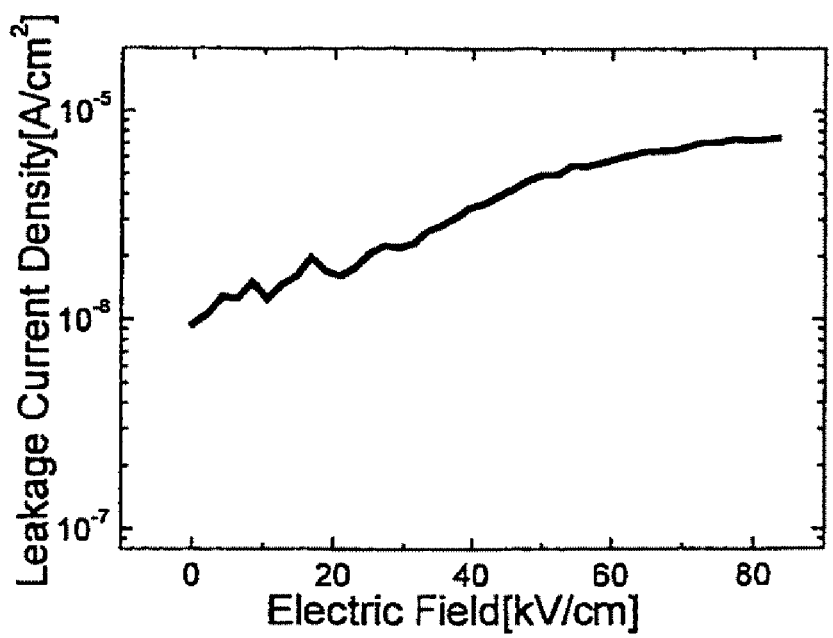
FIG. 16 is a view indicating a result of measurement of a leakage current property in the Example 1 of the present invention.

A leakage current property of the PZT thin film was measured in an I-V measurement mode of a semiconductor parameter analyzer (HP4140B available from Agilent). The measurement was made at different voltage values within a range of 0-2V (in increments of 50 mV). The measurement with electrodes having a diameter of 1000 μm is indicated in FIG. 16. As is apparent from FIG. 16, the measured specific resistance of the PZT thin film was about several tens of MΩ. This specific resistance was considerably low, in view of specific resistance values of common PZT compositions, which are on the order of GΩ. The considerably low specific resistance of the PZT thin film is considered to result from a relatively poor quality of the PZT thin film obtained in Example 1.

(Dielectric Constant and Dielectric Loss of PZT Thin Film)

A dielectric constant of the PZT thin film was measured by an impedance analyzer (HP4294A available from Agilent), and a dielectric loss of the PZT thin film was calculated from a capacity value obtained from a measured electrostatic capacity or capacitance of the PZT thin film. Conditions of the measurement include: a frequency of 1 kHz; an OSC level of 10 mV; a DC bias voltage of 0V; and an electrode diameter of 100 μm. The measured dielectric constant was 1170, and the dielectric loss was 3%.

(Pyroelectric Property of PZT Thin Film)

Pyroelectric current values at different temperatures of the sample were measured. This sample was obtained by a recovery annealing step at 650° C. for 90 seconds after the sputtering to form the upper electrode of Pt. Described in detail, the sample was set in a shield box within a thermostatic chamber or oven, and the temperature within the thermostatic chamber was raised up to 100° C. As a result, the temperature of the sample was slowly raised, and the pyroelectric current induced by a rise of the temperature was measured at a time interval of 10 seconds.

Figure 17:
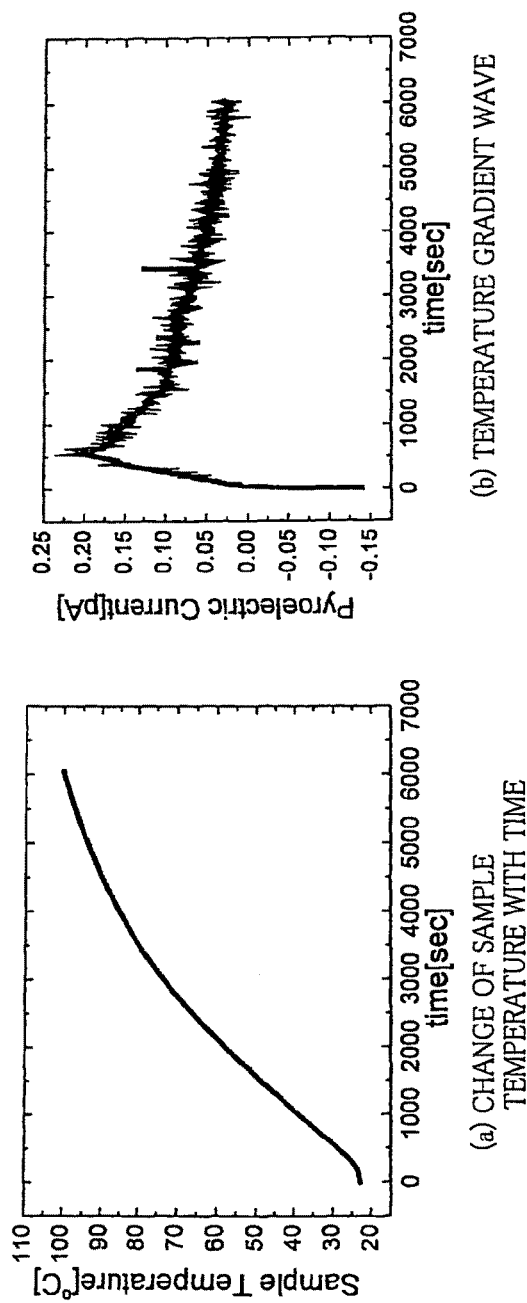
FIG. 17 is a view indicating a result of measurement of a pyroelectric property in the Example 1 of the present invention.

A change of the sample temperature with time is indicated at (a) in FIG. 17, and a wave of a temperature gradient of the sample at the time of measurement of the electric current is indicated at (b) in the same figure, while a wave of the measured electric current is indicated at (c) in the same figure. The pyroelectric current was induced in proportion to the temperature gradient of the sample. FIG. 17 indicates at (d) the wave of the temperature gradient and the wave of the measured pyroelectric current, which are superimposed on each other. As indicated at (d), the above-indicated two waves almost match with each other. It follows from this that the electric current was the pyroelectric current.

Subsequently, the highest pyroelectric current value and the highest temperature gradient value were read from the two obtained waves, and a pyroelectric coefficient $\lambda$ was calculated on the basis of those highest values and according to an equation $\lambda = (Imax)/((dT/dt) \times S)$, wherein Imax represents the highest pyroelectric current value, dT/dt represents the highest temperature gradient value, and S represents a surface area of the electrode. The calculated a pyroelectric coefficient $\lambda$ was $0.14 \times 10^{-8}$ [$C/cm^2/K$]. This value of the pyroelectric coefficient $\lambda$ was lower than a pyroelectric coefficient of $3.0 \times 10^{-8}$ [$C/cm^2/K$] of PZT thin films known in the art, by an amount corresponding to about one digit.

Then, Example 2 according to the second embodiment of this invention will be described.

(Formation of $\gamma$-$Al_2O_3$ Film)

A 2-inch Si(001) substrate and a 2-inch Si(111) substrate were used as silicon substrates. On the 2-inch Si(001) substrate, a $\gamma$-$Al_2O_3$ film was formed by a CVD method. Conditions for the film formation include: a substrate temperature of 1160° C.; a film forming time of 30 minutes; a TMA flow rate of 2.5 sccm; and an $O_2$ flow rate of 20 sccm. On the 2-inch Si(111) substrate, there was formed $\gamma$-$Al_2O_3$ film by an MBE method. Conditions for the film formation include: a substrate temperature of 750° C.; an Al molecular beam pressure of B.G. $1 \times 10^{-6}$ Pa; an $O_2$ flow rate of 1.0 sccm; a growth pressure of $3.3 \times 10^{-3}$ Pa; and a growth time of 60 minutes. The $\gamma$-$Al_2O_3$ films formed on the two Si substrates by the respective two different methods had a thickness of 4 nm.

(Formation of SRO Film)

Then, each of the two composite $\gamma$-$Al_2O_3$/Si substrates obtained by the respective two methods was cut into 2 cm×2 cm square pieces, which were washed by ultrasonic cleaning with organic solutions, namely, with a solution of acetone for 10 minutes, and with a solution of methanol for 10 minutes. Subsequently, the 2 cm×2 cm square pieces of $\gamma$-$Al_2O_3$/Si were set in a sputtering device, and the pressure within a chamber of the sputtering device was evaluated to $10^{-5}$ Pa. Then, the temperatures of the square composite substrates were respectively raised to 500° C., 700° C. and 800° C. After an Ar gas and an $O_2$ gas were introduced into the chamber, a gate valve was opened and closed to regulate the sputtering pressure to an appropriate level for plasma generation. After the plasma generation, a pre-sputtering operation was performed for 5 minutes to form SRO films with adequately regulated RF power. Conditions for the formation of the SRO films include: RF power of 15 W; a film forming time of 60 minutes; a ratio of Ar to $O_2$ is 4:1; and a sputtering pressure of 1 Pa. The SRO films thus formed had thickness values of about 40-60 nm.

(Evaluation of SRO Film)

Figure 18:
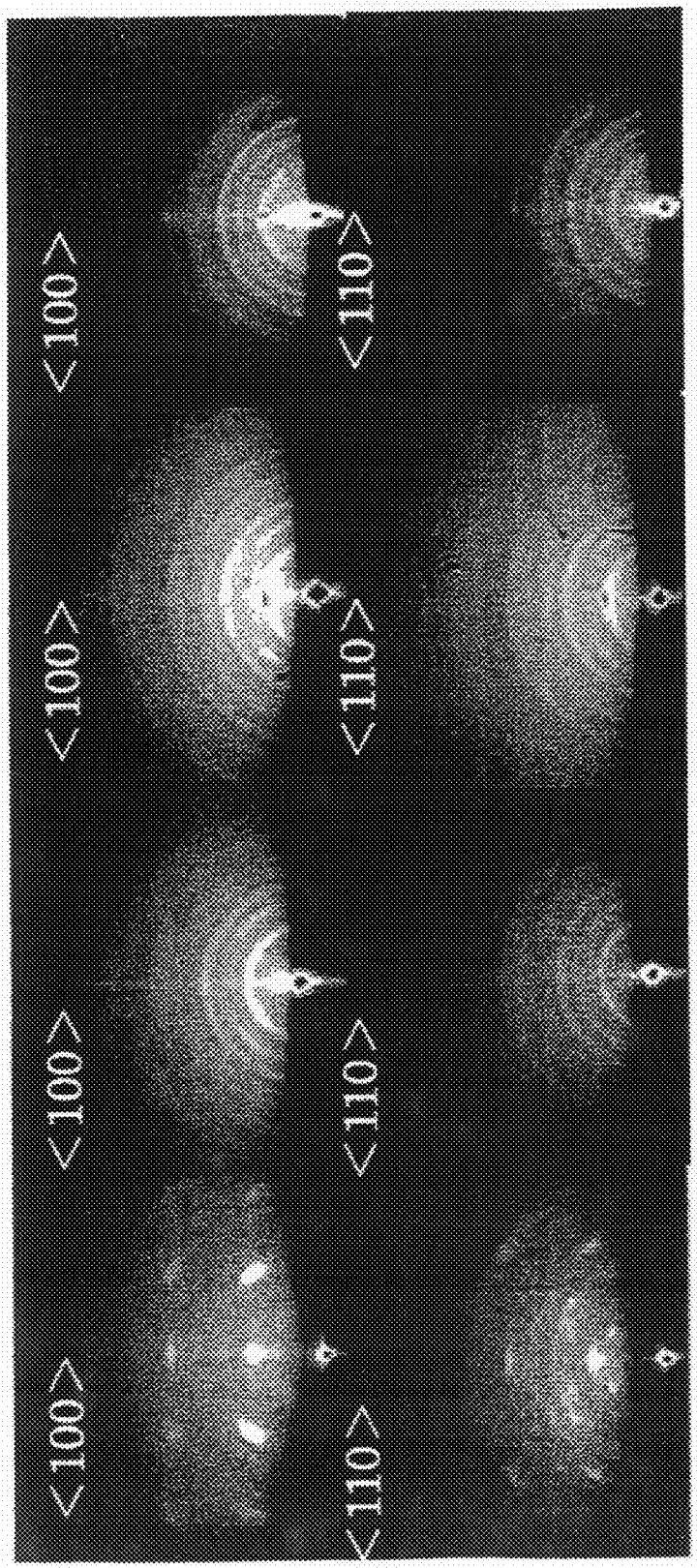
FIG. 18 is a view indicating RHEED patterns of a $SrRuO_3$ film in Example 2 of the present invention.

FIG. 18 indicates measured RHEED patterns of laminar structures of $SrRuO_3/\gamma\text{-}Al_2O_3/Si(001)$. Namely, leftmost two photographs show the RHEED patterns of the composite $\gamma\text{-}Al_2O_3/Si(001)$ substrates on which the $SrRuO_3$ were formed, while the other six photographs show the RHEED patterns of the laminar structures of $SrRuO_3/\gamma\text{-}Al_2O_3/Si(001)$. No difference in the RHEED patterns of the laminar structures of $SrRuO_3/\gamma\text{-}Al_2O_3/Si(001)$ depending upon the direction of incidence was confirmed for all of the different temperatures of the composite substrates. Since ring patterns were observed, the $SrRuO_3$ films formed on the composite $\gamma\text{-}Al_2O_3/Si(001)$ substrates are considered to be polycrystalline films.

Figure 19:
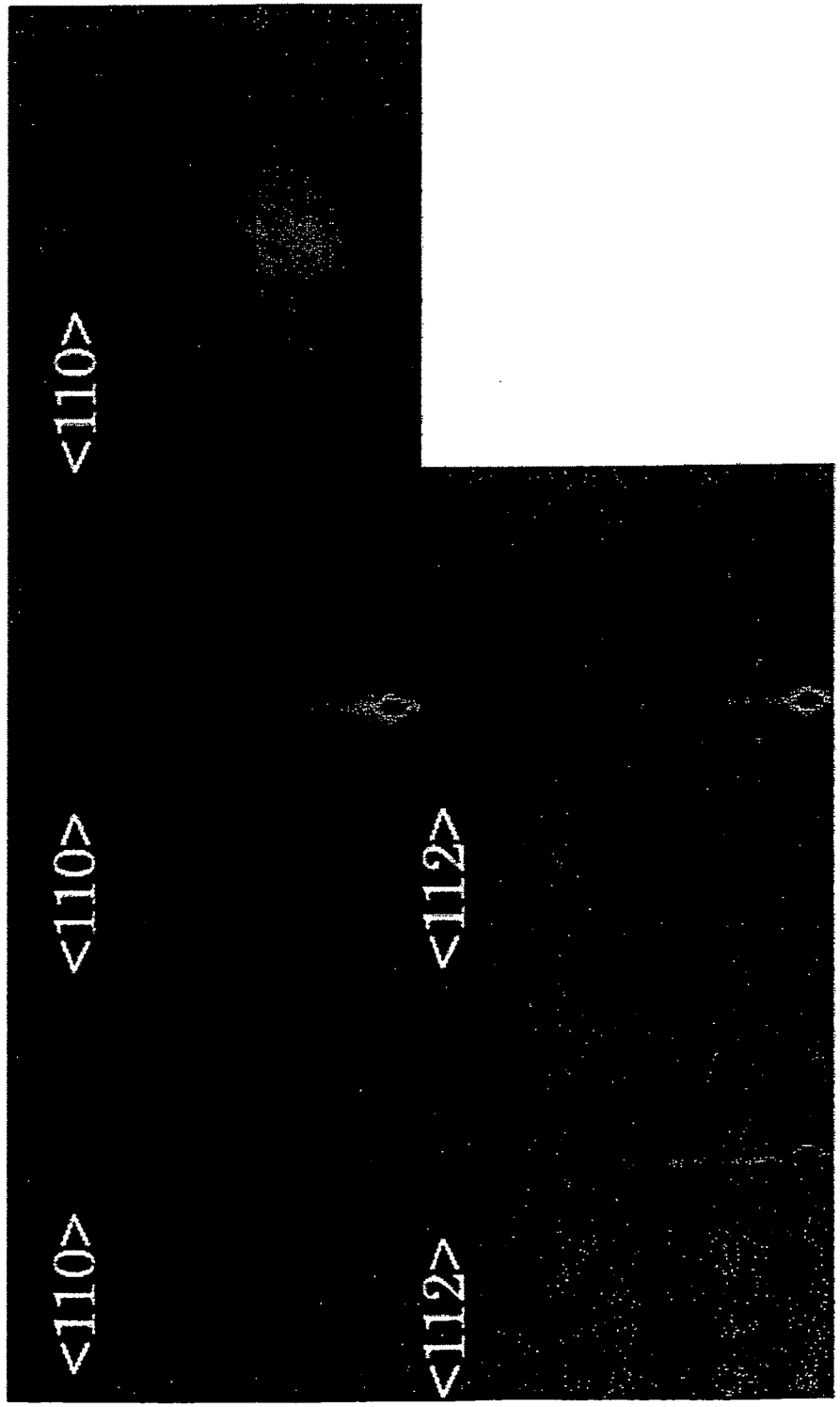
FIG. 19 is a view indicating RHEED patterns of the $SrRuO_3$ film in Example 2 of the present invention.

FIG. 19 indicates measured RHEED patterns of laminar structures of $SrRuO_3/\gamma\text{-}Al_2O_3/Si(111)$. Namely, leftmost two photographs show the RHEED patterns of the composite $\gamma\text{-}Al_2O_3/Si(111)$ substrates on which the $SrRuO_3$ were formed, while the other three photographs show the RHEED patterns of the laminar structures of $SrRuO_3/\gamma\text{-}Al_2O_3/Si(111)$. A difference in the RHEED patterns of the laminar structures of $SrRuO_3/\gamma\text{-}Al_2O_3/Si(111)$ depending upon the direction of incidence was confirmed for the composite substrate temperature of 750° C. Further, spot patterns were confirmed for the composite substrate temperature of 750° C. Since ring patterns were also confirmed, the $SrRuO_3$ films formed on the composite $\gamma\text{-}Al_2O_3/Si(111)$ substrates are not considered to have been completely epitaxially grown. It is noted that for the composite substrate temperature of 800° C., a hollow pattern was configured.

Figure 20:
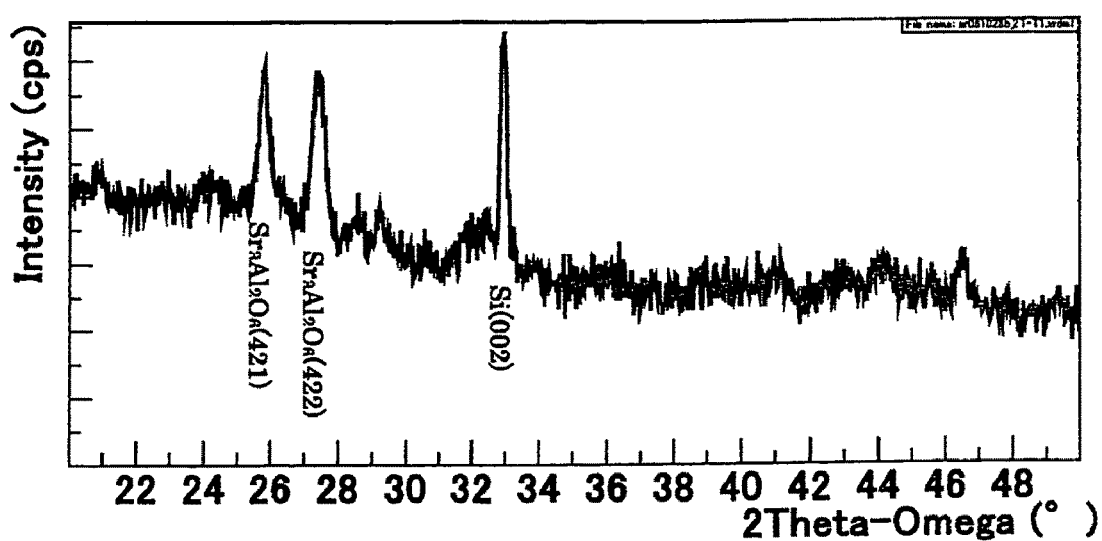
FIG. 20 is a view indicating an XRD pattern in the Example 2 of the present invention.
Figure 21:
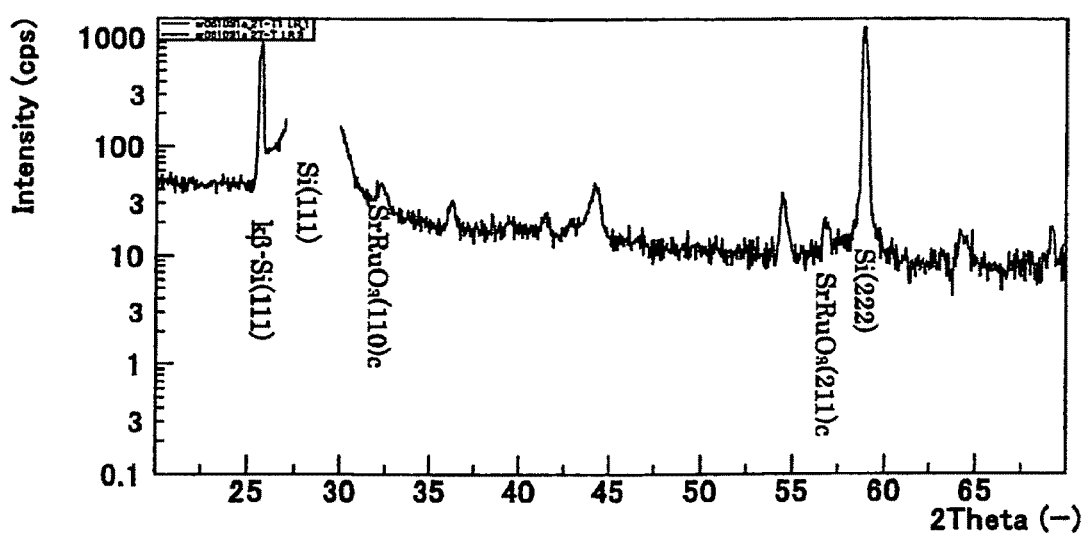
FIG. 21 is a view indicating an XRD pattern in the Example 2 of the present invention.

FIG. 20 indicates measured XRD patterns of the obtained laminar structures of $SrRuO_3/\gamma\text{-}Al_2O_3/Si(001)$. It will be understood from FIG. 20 that the $SrRuO_3$ films of these laminar structures are polycrystalline films. FIG. 21 indicates measured XRD patterns of the obtained laminar structures of $SrRuO_3/\gamma\text{-}Al_2O_3/Si(111)$. It will be understood from FIG. 21 that the $SrRuO_3$ films of these laminar structures were not completely epitaxially grown.

Then, Example 3 according to the third embodiment of this invention will be described.

(Formation of $SrRuO_3$ Film on Composite $Pt/\gamma\text{-}Al_2O_3$ Substrate)

A 2-inch Si(001) substrate and a 2-inch Si(111) substrate were used as silicon substrates. On the 2-inch Si(001) substrate, a $\gamma\text{-}Al_2O_3$ film was formed by a CVD method. Conditions for the film formation include: a substrate temperature of 1160° C.; a film forming time of 30 minutes; a TMA flow rate of 2.5 sccm; and an $O_2$ flow rate of 20 sccm. On the 2-inch Si(111) substrate, there was formed $\gamma\text{-}Al_2O_3$ film by an MBE method. Conditions for the film formation include: a substrate temperature of 750° C.; an Al molecular beam pressure of B.G. $1\times10^{-6}$ Pa; an $O_2$ flow rate of 1.0 sccm; a growth pressure of $3.3\times10^{-3}$ Pa; and a growth time of 60 minutes. The $\gamma\text{-}Al_2O_3$ films formed on the two Si substrates by the respective two different methods had a thickness of 4 nm.

(Formation of SRO Film)

Then, each of the two composite $\gamma\text{-}Al_2O_3$ film/Si substrates obtained by the respective two methods was cut into 2 cm×2 cm square pieces, which were washed by ultrasonic cleaning with organic solutions, namely, with a solution of acetone for 10 minutes, and with a solution of methanol for 10 minutes. Then, Pt films were formed by a sputtering method on the composite 2 cm×2 cm square $\gamma\text{-}Al_2O_3$ film/Si substrates. Conditions for the Pt film formation include: RF power of 75 W; a composite substrate temperature of 550° C.; a film forming time of 10 minutes; and an Ar flow rate of 72 sccm. The formed Pt films had a thickness of 100 nm.

Subsequently, the 2 cm×2 cm laminar structures of $Pt/\gamma\text{-}Al_2O_3$ film/Si were cut into 1 cm×1 cm square pieces, which were washed by ultrasonic cleaning with organic solutions, namely, with a solution of acetone for 10 minutes, and with a solution of methanol for 10 minutes. Then the 1 cm×1 cm square pieces of $Pt/\gamma\text{-}Al_2O_3/Si$ were set in a sputtering device, and the pressure within a chamber of the sputtering device was evaluated to $10^{-5}$ Pa. Then, the temperatures of the square composite substrates were respectively raised to 500° C., 700° C. and 800° C. After an Ar gas and an $O_2$ gas were introduced into the chamber, a gate valve was opened and closed to regulate the sputtering pressure to an appropriate level for plasma generation. After the plasma generation, a pre-sputtering operation was performed for 5 minutes to form SRO films with adequately regulated RF power. Conditions for the formation of the SRO films include: RF power of 15 W; a film forming time of 60 minutes; a ratio of Ar to $O_2$ is 4:1; and a sputtering pressure of 1 Pa. The SRO films thus formed had thickness values of about 40-60 nm.

(Evaluation of SRO Film)

Figure 22:
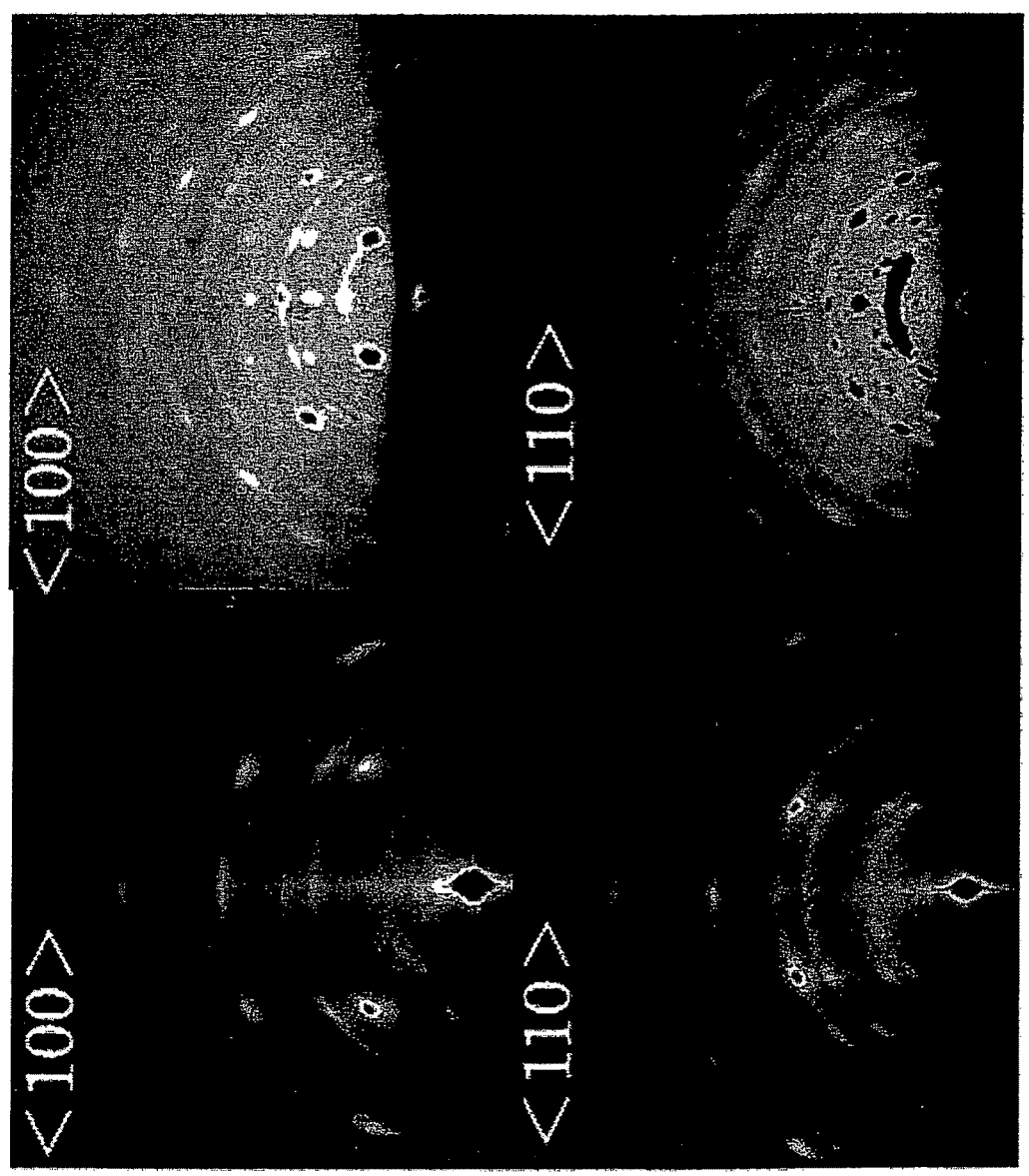
FIG. 22 is a view indicating RHEED patterns of a $SrRuO_3$ film in Example 3 of the present invention.

FIG. 22 indicates measured RHEED patterns of laminar structures of $SrRuO_3/\gamma\text{-}Al_2O_3/Si(001)$. Namely, two left photographs show the RHEED patterns of the composite $Pt/\gamma\text{-}Al_2O_3/Si(001)$ substrates on which the $SrRuO_3$ were formed, while two right photographs show the RHEED patterns of the laminar structures of $SrRuO_3/Pt/\gamma\text{-}Al_2O_3/Si(001)$. A difference in the RHEED patterns of the laminar structures of $SrRuO_3/Pt/\gamma\text{-}Al_2O_3/Si(001)$ depending upon the direction of incidence was confirmed. Further, spot patterns were confirmed. However, since ring patterns were also confirmed, the $SrRuO_3$ films formed on the composite $\gamma\text{-}Al_2O_3/Si(001)$ substrates are not considered to have been completely epitaxially grown. A measured specific resistance of the laminar structures was 9.7 [μΩ·cm]. This specific resistance value is lower than a specific resistance of 150 [μΩ·cm] of $SrRuO_3$ in bulk. This reduction of the specific resistance appears to result from the interposition of the Pt film.

Figure 23:
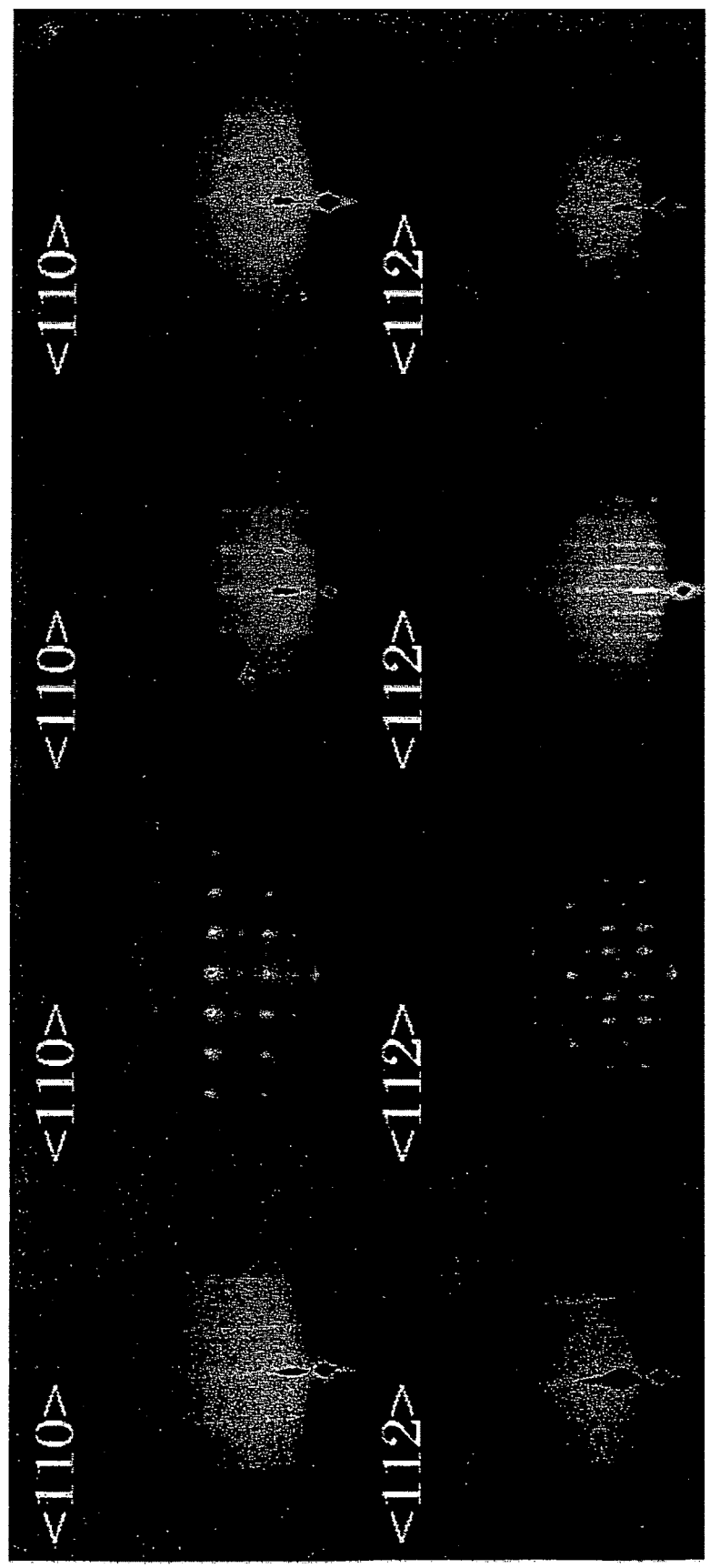
FIG. 23 is a view indicating RHEED patterns of the $SrRuO_3$ film in Example 3 of the present invention.

FIG. 23 indicates measured RHEED patterns of laminar structures of $SrRuO_3/Pt/\gamma\text{-}Al_2O_3/Si(111)$. Namely, two left photographs show the RHEED patterns of the composite $Pt/\gamma\text{-}Al_2O_3/Si(111)$ substrates on which the $SrRuO_3$ were formed, while the other six photographs show the RHEED patterns of the laminar structures of $SrRuO_3/Pt/\gamma\text{-}Al_2O_3/Si(111)$. A difference in the RHEED patterns of the laminar structures of $SrRuO_3/Pt/\gamma\text{-}Al_2O_3/Si(111)$ depending upon the direction of incidence was confirmed. Further, spot patterns of the laminar structures were confirmed. In addition, a change of the spot patterns into streak patterns with a rise of the composite substrate temperature was confirmed. This reveals surface flattening of the $SrRuO_3$ film with the rise of the composite substrate temperature. A measured specific resistance of the laminar structures was 26.4 [μΩ·cm]. This specific resistance value is lower than the specific resistance of 150 [μΩ·cm] of SrRuO$_3$ in bulk. This reduction of the specific resistance appears to result from the interposition of the Pt film.

Figure 24:
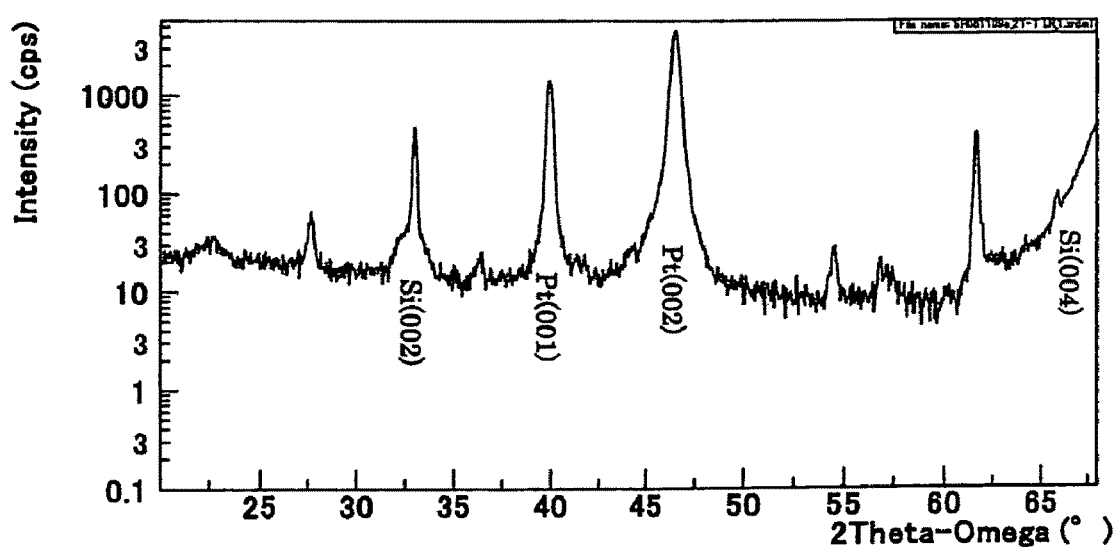
FIG. 24 is a view indicating an XRD pattern in the Example 3 of the present invention.

FIG. 24 indicates measured XRD patterns of the obtained laminar structures of SrRuO$_3$/Pt/γ-Al$_2$O$_3$/Si(001). It will be understood from FIG. 24 that a peak of SrRuO$_3$ was hidden by a peak of Pt and was not confirmed.

Figure 25:
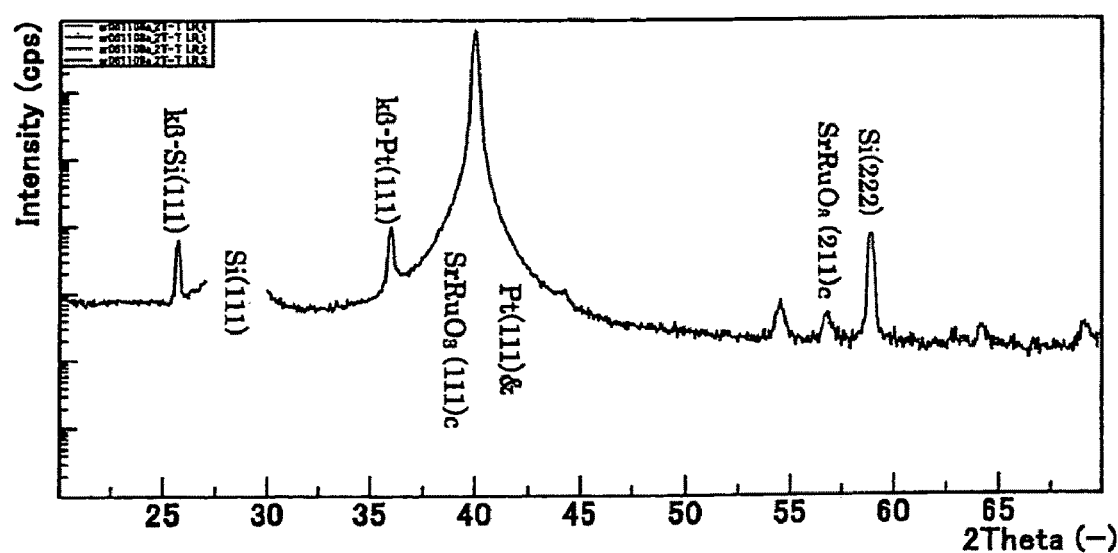
FIG. 25 is a view indicating an XRD pattern in the Example 3 of the present invention.

FIG. 25 indicates measured XRD patterns of the obtained laminar structures of SrRuO$_3$/Pt/γ-Al$_2$O$_3$/Si(111). It will be understood from FIG. 25 that a peak of SrRuO$_3$(111) was hidden by a peak of Pt(111) since the peaks of SrRuO$_3$(111) and Pt(111) were close to each other and since the peak of Pt(111) was higher. However, the measured RHEED patterns indicate that the SrRuO$_3$ film was epitaxially grown on the Pt film.

(Formation of PZT Thin Film)

A PZT thin film (Pb(Zr$_{0.52}$, Ti$_{0.48}$)O$_3$) was formed on the composite SrRuO$_3$/Pt/γ-Al$_2$O$_3$/Si(111) substrate. The PZT thin films were also formed on comparative composite substrates, that is, Pt(111)/Ti/SiO$_2$/Si(001) substrate, and Pt/γ-Al$_2$O$_3$/Si(111) substrate. The PZT thin films were formed by a sol-gel method illustrated in FIG. 26. The process of FIG. 26 was repeated 13 times, to form the PZT thin films having a thickness of 1.3 μm. The composite substrates were 2 cm×2 cm square substrates.

Figure 27:
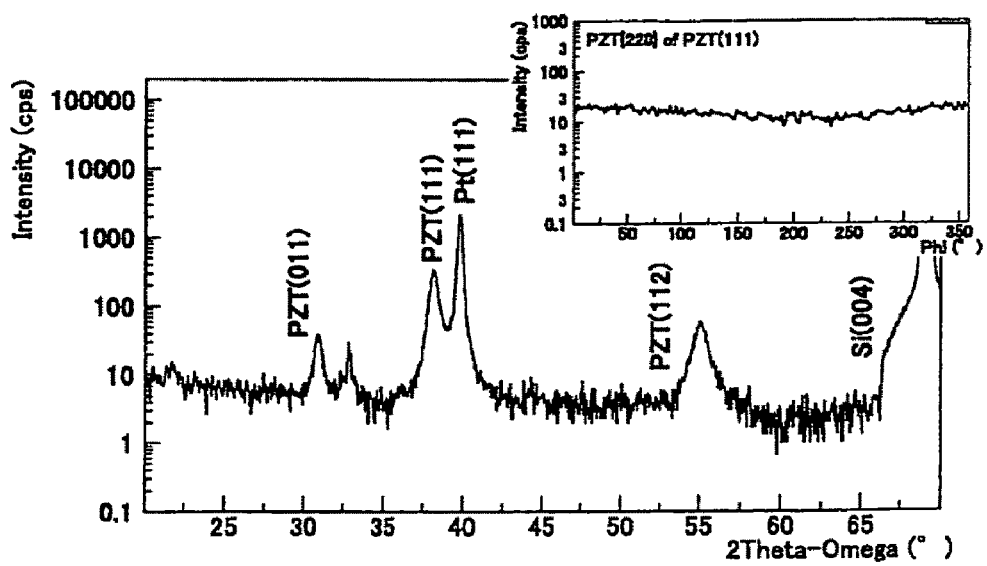
FIG. 27 is a view for explaining XRD patterns in the Example 3 of the present invention.
Figure 27:
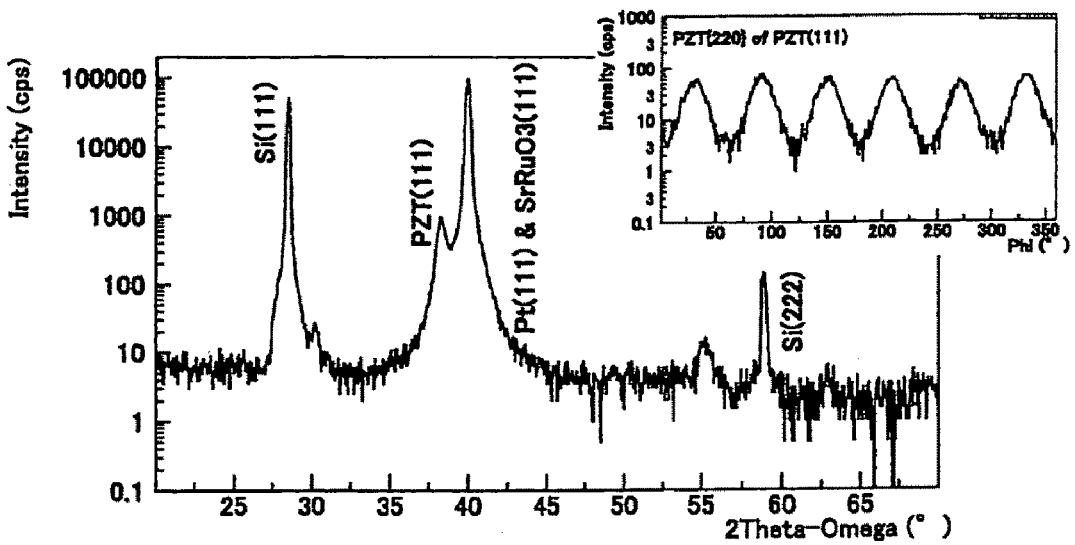

The laminar structure formed by forming the PZT thin film on the comparative composite Pt/γ-Al$_2$O$_3$/Si(111) substrate suffered from a feel-off phenomenon at the boundary between the PZT thin film and the Pt film, during the first implementation of the RTA process. The laminar structures formed by forming the PZT thin films on the other composite substrates did not suffer from such a peel-off phenomenon or a cracking phenomenon. FIG. 27 indicates measured XRD patterns of the PZT thin films. As indicated at (a) in FIG. 27, the PZT thin film formed on the comparative composite Pt(111)/Ti/SiO$_2$/Si(111) substrate was predominantly (111)-oriented, but peaks of other perovskite phases were observed, and polycrystallinity of the PZT thin film was observed. On the other hand, the PZT thin film formed on the composite SrRuO$_3$/Pt/γ-Al$_2$O$_3$/Si(111) substrate had a PZT(111) peak, and was found by Φ scanning of PZT{220}, to be an epitaxial film having a symmetric waveform of six peaks. Measurement of the locking curve of the PZT(111) peak revealed a half-value width of about 16° for the composite Pt(111)/Ti/SiO$_2$/Si(111) substrate, and a half-value width of about 10° for the composite SrRuO$_3$/Pt/γ-Al$_2$O$_3$/Si(111) substrate.

Then, Example 4 according to the fourth embodiment of this invention will be described.

(Formation of γ-Al$_2$O$_3$ Film)

The γ-Al$_2$O$_3$ film was epitaxially grown on a (100)-oriented silicon substrate. Conditions for the epitaxial growth by a CVD apparatus include: a substrate temperature of 900-950° C.; a pressure of 5-500 Pa; and a growth time of 30 minutes. The formed γ-Al$_2$O$_3$ film had a thickness of 50 nm, and was (100)-oriented.

(Formation of LNO Film)

Then, an LNO film was formed on the γ-Al$_2$O$_3$ film. The LNO film was formed by a sol-gel method. The sol-gel method includes a step of coating a desired substrate with a precursor solution to form a coating film, a step of drying the film of the precursor solution by a suitable heat treatment, and a step of decomposing and removing organic components of the precursor solution, to eventually crystallize the precursor into a thin film of LNO having a desired composition. In the present example, the coating step was implemented by a spin-coating operation which requires a relatively small amount of the precursor solution. In the present example, the precursor solution had a precursor concentration of 0.3M, and the spin-coating operation was repeated five times to form the (100)-oriented LNO film which consists of five layers each having a thickness of about 20 nm and which has a total thickness of 100 nm.

(Formation of Pt Film)

A (110)-oriented Pt film was formed by an RF sputtering method on the (100)-oriented LNO film. Conditions for the RF sputtering method include: a substrate temperature of 550-650° C. during the sputtering operation; RF power of 0.8-1.2 W/cm$^2$.

(Formation of PZT Thin Film)

A PZT thin film was formed on the Pt film. The PZT thin film was formed by the sol-gel method. The Zr/Ti ratio of PZT used was 40/60. Each layer of the PZT thin film formed by the spin coating operation was about 80 nm. Since the PZT thin film consists of three layers, the total thickness was about 240 nm.

(Evaluation of PZT Thin Film)

Figure 28:
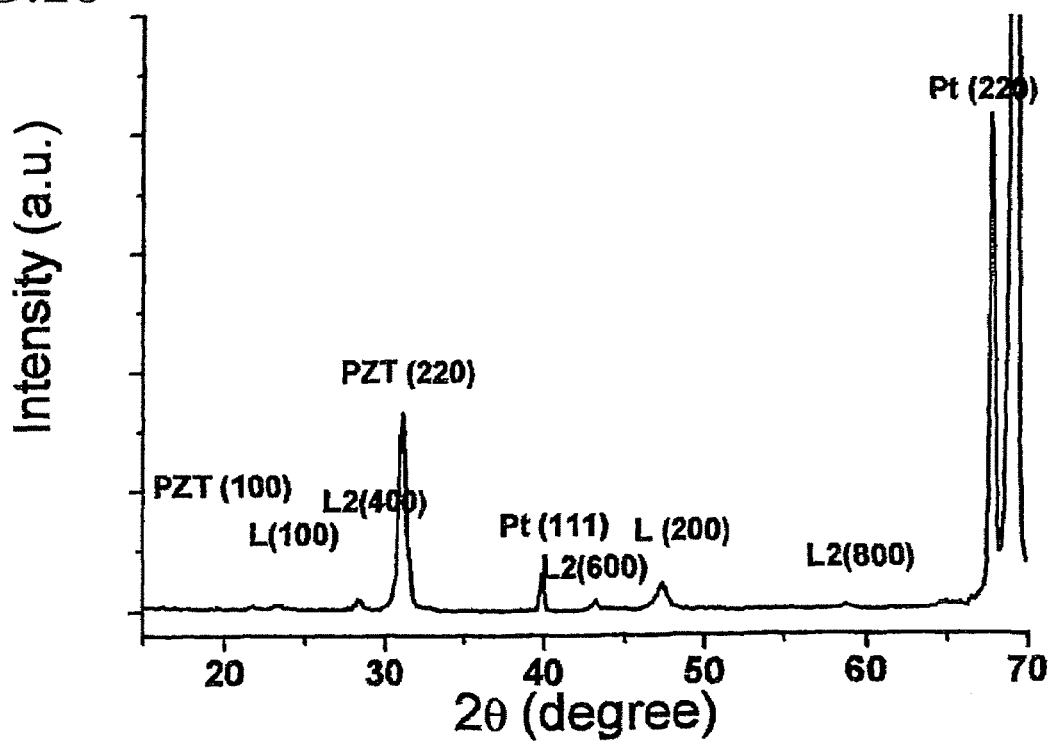
FIG. 28 is a view indicating an XRD pattern in Example 4 of the present invention.

The measured XRD pattern of the PZT thin film on a composite Pt/LNO/γ-Al$_2$O$_3$/Si substrate is indicated in FIG. 28. It will be understood from FIG. 28 that the Pt film and the PZT thin film formed on the LNO(100) film were strongly (110)-oriented. The use of the composite Pt/LNO/γ-Al$_2$O$_3$/Si substrate realized the (110) orientation of PZT.

(Formation of Upper Pt Film)

To evaluate the electric properties of the obtained laminar structure, a Pt film was formed as the upper electrode on the composite PZT/Pt/LNO/γ-Al$_2$O$_3$/Si substrate. The Pt film having a thickness of about 100 nm was formed by a sputtering method.

(Ferroelectric Property of PZT Thin Film)

Figure 29:
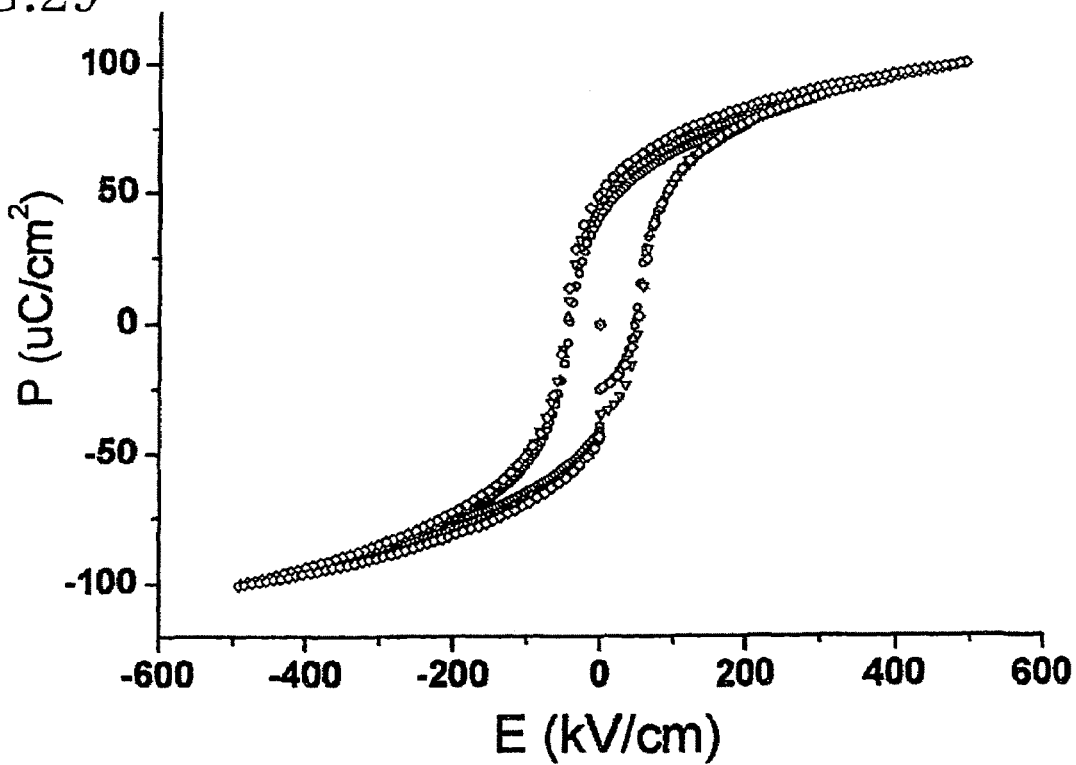
FIG. 29 is a view indicating a result of measurement of a ferroelectric property in the Example 4 of the present invention.

The ferroelectric property of the PZT thin film was measured in a hysteresis measurement mode by a ferroelectric thin film evaluating apparatus (FCE-2 available from Toyo Technica), at ±10V. The ferroelectric property measured with electrodes having a diameter of 300 μm is indicated in FIG. 29. It will be understood from FIG. 29 that the PZT thin film demonstrated a hysteresis property indicating high ferroelectricity, that is, saturated polarization value of (2 Ps) 156 μC/cm$^2$, and residual polarization value of (2 Ps) 98 μC/cm$^2$, which are higher than those of the (100)- or (111)-oriented PZT thin films known in the art.

(Pyroelectric Property of PZT Thin Film)

Pyroelectric current values at different temperatures of the sample were measured. The sample was set in a shield box within a thermostatic chamber or oven, and the temperature within the thermostatic chamber was raised up to 100° C. As a result, the temperature of the sample was slowly raised, and the pyroelectric current induced by a rise of the temperature was measured at a time interval of 10 seconds.

The PZT thin film had a pyroelectric coefficient of $9.0 \times 10^{-8}$ C/cm$^2$K$^{-1}$. This pyroelectric coefficient is higher than $3\sim5\times10^{-8}$ C/cm$^2$K$^{-1}$ of common PZT thin films or ceramics known in the art, and permits an improvement of the performance of memory elements, sensors and actuators which are obtained by the laminar structure including the present PZT thin film.

The invention claimed is:

1. A laminar structure on a semiconductor substrate, comprising:
    a buffer layer formed on said semiconductor substrate;
    a thin film LaNiO$_3$ (LNO) formed on the buffer layer;
    a (110)-oriented thin film of Pt formed directly on said thin film of LNO; and
    a (110)-oriented thin film of ferroelectric material formed directly on said (110)-oriented thin film of Pt.

2. The laminar structure according to claim 1, wherein said buffer layer is an insulating layer.

3. The laminar structure according to claim 1, wherein said buffer layer is an epitaxially grown thin film of $\gamma\text{-Al}_2\text{O}_3$.

4. The laminar structure according to claim 1, further comprising an upper electrode on said (110)-oriented thin film of the ferroelectric material.

5. The laminar structure according to claim 1, wherein said (110)-oriented thin film of the ferroelectric material is a (110)-oriented thin film of $\text{Pb(Zr, Ti)O}_3$.

6. The laminar structure according to claim 1, wherein said semiconductor substrate is a monocrystalline substrate of silicon.

7. The laminar structure according to claim 6, further comprising a monocrystalline film of $\gamma\text{-Al}_2\text{O}_3$ being formed as a buffer layer between said semiconductor substrate and said thin film of $\text{LaNiO}_3$, and said thin film of $\text{LaNiO}_3$, said monocrystalline film of $\gamma\text{-Al}_2\text{O}_3$ and said monocrystalline substrate of silicon are all (100)-oriented.

* * * * *